United States Patent
Huh et al.

(10) Patent No.: US 10,516,433 B2
(45) Date of Patent: *Dec. 24, 2019

(54) MODEM AND RF CHIPS, APPLICATION PROCESSOR INCLUDING THE SAME AND OPERATING METHOD THEREOF

(71) Applicant: SAMSUNG ELECTRONICS CO., LTD., Suwon-si, Gyeonggi-do (KR)

(72) Inventors: Jun-Ho Huh, Yongin-si (KR); Ho-Rang Jang, Seoul (KR); Seok-Chan Kim, Seoul (KR); In-Tae Kang, Hwasong-si (KR); Sang-Heon Lee, Seongnam-si (KR); Kwan-Yeob Chae, Hwaseong-si (KR); June-Hee Lee, Yongin-si (KR); Sang-Hune Park, Seongnam-si (KR); Jae-Chol Lee, Suwon-si (KR); Hyung-Kweon Lee, Yeongsu-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/037,024

(22) Filed: Jul. 17, 2018

(65) Prior Publication Data

US 2018/0323820 A1 Nov. 8, 2018

Related U.S. Application Data

(63) Continuation of application No. 15/614,667, filed on Jun. 6, 2017, now Pat. No. 10,050,661.

(30) Foreign Application Priority Data

Aug. 26, 2016 (KR) .................. 10-2016-0109551

(51) Int. Cl.
*H03M 3/00* (2006.01)
*H04B 1/44* (2006.01)
(Continued)

(52) U.S. Cl.
CPC ............... *H04B 1/44* (2013.01); *H03M 3/00* (2013.01); *H03M 3/462* (2013.01); *H03M 3/466* (2013.01);
(Continued)

(58) Field of Classification Search
CPC ........ H03M 3/466; H03M 3/462; H03M 3/00; H04L 27/06; H04L 27/2655; H04L 27/2656; H04B 1/44
(Continued)

(56) References Cited

U.S. PATENT DOCUMENTS 5,646,966 A 7/1997 Chaki et al.
6,034,992 A 3/2000 Miron et al.
(Continued)

FOREIGN PATENT DOCUMENTS

CN 1640078 A 7/2005
CN 103856232 A 6/2014
(Continued)

OTHER PUBLICATIONS

Chinese Office Action dated Oct. 29, 2019, Issued in Corresponding Application No. CN 201710418689.3.

*Primary Examiner* — Lam T Mai
(74) *Attorney, Agent, or Firm* — Volentine, Whitt & Francos, PLLC

(57) ABSTRACT

A modem chip communicates with a radio frequency (RF) chip and includes a digital interface configured to receive data including a plurality of samples from the RF chip based on digital communication. A logic block generates a frame synchronization signal based on a clock signal in the modem (Continued)

chip, provides the generated frame synchronization signal to the digital interface, and receives the plurality of samples in synchronization with the frame synchronization signal.

20 Claims, 20 Drawing Sheets

(51) Int. Cl.
　　　*H04L 27/06*　　　(2006.01)
　　　*H04L 27/26*　　　(2006.01)
　　　*H04L 7/04*　　　(2006.01)
　　　*H04J 3/06*　　　(2006.01)

(52) U.S. Cl.
　　　CPC ............... *H04L 7/04* (2013.01); *H04L 27/06* (2013.01); *H04L 27/2655* (2013.01); *H04L 27/2656* (2013.01); *H04J 3/0685* (2013.01)

(58) Field of Classification Search
　　　USPC .................................................. 341/143–155
　　　See application file for complete search history.

(56) References Cited

U.S. PATENT DOCUMENTS

| | | | |
|---|---|---|---|
| 6,198,753 | B1 | 3/2001 | Virdee et al. |
| 8,538,348 | B2 | 9/2013 | Oga |
| 8,787,471 | B1 | 7/2014 | Lifshitz |
| 8,842,654 | B2 | 9/2014 | Pan et al. |
| 9,118,418 | B2 | 8/2015 | Oh et al. |
| 9,246,557 | B2 | 1/2016 | Saban et al. |
| 9,661,191 | B2 | 5/2017 | Muraki et al. |
| 10,050,661 | B2 * | 8/2018 | Huh ..................... H03M 3/00 |
| 2003/0147459 | A1 | 8/2003 | Ryter |
| 2004/0204096 | A1 | 10/2004 | Hirsch et al. |
| 2005/0007988 | A1 | 1/2005 | Ferris et al. |
| 2010/0056201 | A1 | 3/2010 | Akamine et al. |
| 2011/0075773 | A1 | 3/2011 | Allpress et al. |
| 2016/0056844 | A1 | 2/2016 | Sabiani et al. |

FOREIGN PATENT DOCUMENTS

| | | |
|---|---|---|
| CN | 104618042 A | 5/2015 |
| JP | 2014-236491 | 12/2014 |
| KR | 10-0945340 | 2/2010 |

\* cited by examiner

MODEM AND RF CHIPS, APPLICATION PROCESSOR INCLUDING THE SAME AND OPERATING METHOD THEREOF

CROSS-REFERENCE TO RELATED APPLICATION

This application is a Continuation of U.S. application Ser. No. 15/614,667, filed Jun. 6, 2017, which claims the benefit of Korean Patent Application No. 10-2016-0109551, filed on Aug. 26, 2016, in the Korean Intellectual Property Office, the disclosure of which is incorporated herein in its entirety by reference.

BACKGROUND

The disclosure relates to a modem chip, and more particularly, to a modem chip performing digital communication with a radio frequency (RF) chip, an application processor including the modem chip, and an operating method of the modem chip.

Recently, as a great amount of data is transmitted or received by using a smart phone and the like, the amount of data that is transmitted or received between an RF chip and a modem chip has also increased. Various communication methods between the RF chip and the modem chip have been proposed. For example, a method of transmitting and receiving I,Q analog signals between the RF chip and the modem chip by using a digital communication method has been proposed.

However, various problems may occur due to digital communication between the RF chip and the modem chip. For example, the number of channels for data transmission may increase depending on an increase in the bandwidth of data. In addition, as the RF chip and the modem chip use different clock sources, the performance of the modem chip may degrade due to a frequency offset.

SUMMARY

The disclosure provides a modem chip for preventing performance degradation that may be caused due to digital communication between a radio frequency (RF) chip and a modem chip, an application processor including the modem chip, and an operating method of the modem chip.

According to an aspect of the disclosure, there is provided a modem chip for communicating with a radio frequency (RF) chip, the modem chip including a digital interface configured to receive data including a plurality of samples from the RF chip, based on digital communication. A logic block is configured to generate a frame synchronization signal based on a clock signal in the modem chip, provide the generated frame synchronization signal to the digital interface, and receive the plurality of samples in synchronization with the frame synchronization signal.

According to another aspect of the disclosure, there is provided an application processor including a central processing unit (CPU), a memory configured to store programs that are executable by the CPU, and a modem. The modem includes a digital interface for communication with a radio frequency (RF) chip outside the application processor and a logic block for processing samples transmitted through the digital interface. The samples are transmitted from the digital interface to the logic block in synchronization with a frame synchronization signal generated based on a clock signal in the modem.

According to another aspect of the disclosure, there is provided an operating method of a modem chip. The method includes receiving data through digital communication with a radio frequency (RF) chip, extracting samples included in the received data, and performing logic processing on the samples in synchronization with a frame synchronization signal generated by using a clock signal in the modem chip.

According to another aspect of the disclosure, there is provided a radio frequency (RF) chip having a phase-locked loop (PLL) a digital interface, and a PLL controller. The PLL generates a clock signal having a frequency and phase controlled by an input signal. The digital interface communicates with a digital interface of a baseband chip. And, the PLL controller controls, through the input signal provided to the PLL, the phase of the PLL in accordance with a signal received from the baseband chip through the digital interface.

According to the disclosure, problems such as latency variation and a frequency offset which may be caused by digital communication between an RF chip and a modem chip may be prevented. In addition, performance may be improved due to synchronization between various functional blocks of the RF chip and the modem chip, and power consumption and RF interference may also be reduced.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
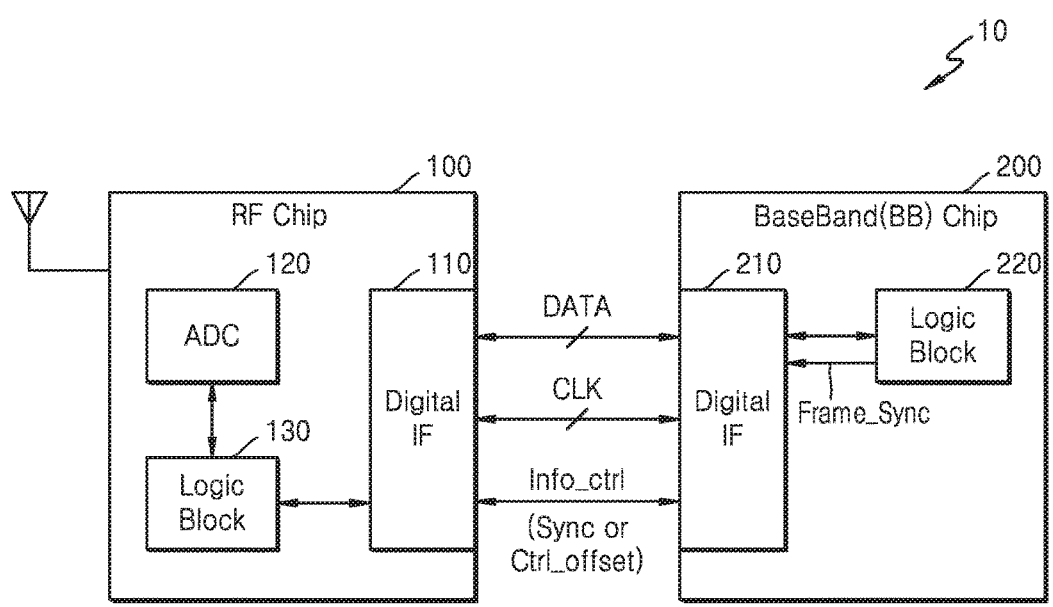
FIG. 1 is a block diagram of a communication system according to an embodiment.

The disclosure will be described more fully hereinafter with reference to the accompanying drawings, in which embodiments of the disclosure are shown. Like reference numerals denote like elements in the drawings.

FIG. 1 is a block diagram of a communication system 10 according to an embodiment.

Referring to FIG. 1, the communication system 10 may correspond to various terminals for performing communication. For example, the communication system 10 may be commonly called a mobile or stationary user terminal, such as user equipment (UE), a mobile station (MS), and an advanced mobile station (AMS). Examples of the user terminal may include a smart phone, a tablet, a personal computer (PC), a mobile phone, a video phone, an e-book reader, a netbook PC, and the like.

The communication system 10 may include a radio frequency (RF) chip 100 and a baseband (BB) chip 200. The BB chip 200 may be a modem chip processing a baseband signal. The RF chip 100 may be connected to an antenna and process a high frequency signal. For example, the RF chip 100 may convert a high frequency signal received through the antenna into a low frequency signal and transmit the low frequency signal to the BB chip 200. In addition, the RF chip 100 may receive a low frequency signal from the BB chip 200, convert the received low frequency signal into a high frequency signal, and transmit the high frequency signal to the outside through the antenna.

Although not illustrated in FIG. 1, the communication system 10 may further generate an intermediate frequency (IF) signal in a frequency conversion process, and in this case, the communication system 10 may further include an IF signal processor (not shown). The function of the IF signal processor may be implemented in the BB chip 200. Alternatively, the IF signal processor may be implemented as a separate chip and be between the RF chip 100 and the BB chip 200.

The RF chip 100 may include a digital interface 110 for performing digital communication with the BB chip 200, an analog-to-digital converter (ADC) 120, and a logic block 130. The BB chip 200 may include a digital interface 210 and a logic block 220. Each of the logic blocks 130 and 220 of the RF and BB chips 100 and 200 may include logic circuits that perform, by hardware, various logical processes related to data. Alternatively, each of the logic blocks 130 and 220 may include elements for performing, by software, various logical processes related to data and, for example, may include one or more processors in addition to a memory that stores programs. Alternatively, each of the logic blocks 130 and 220 may include hardware elements and software elements together to perform various logical processes related to data.

Each of the digital interfaces 110 and 210 may be defined as a block including various elements related to transmission of various signals. For example, each of the digital interfaces 110 and 210 may include elements (for example, PHY, LINK, and a channel) for transmission and reception of data DATA. Also, each of the digital interfaces 110 and 210 may further include elements (for example, a control interface and a channel) for transmission and reception of control information Info_ctrl.

Each of the digital interfaces 110 and 210 may perform a framing operation of configuring data (for example, frame data) in units of frames or a deframing operation of extracting samples from the frame data, and may also perform data ordering related to physical transmission. Each of the digital interfaces 110 and 210 may include hardware circuits for performing digital communication including functions as described above or may include hardware circuits and software elements together.

Although not illustrated in FIG. 1, each of the RF chip 100 and the BB chip 200 may include a clock generator for generating a clock signal that is used in various digital process operations. Each of the RF chip 100 and the BB chip 200 may include one or more phase locked loops (PLLs) as the clock generator. According to an embodiment, a logic process and data communication through a digital interface, which are performed in each of the RF chip 100 and the BB chip 200, may be performed in different frequency domains. For example, in the RF chip 100, the ADC 120 and the logic block 130 may operate in a first frequency domain at a relatively low frequency and the digital interface 110 may operate in a second frequency domain at a relatively high frequency. Similarly, in the BB chip 200, the logic block 220 may operate in a first frequency domain at a relatively low frequency and the digital interface 210 may operate in a second frequency domain at a relatively high frequency. According to an embodiment, clock signals having the same frequency may be respectively provided to the digital interface 110 of the RF chip 100 and the digital interface 210 of the BB chip 200, and in addition, clock signals having the same frequency may be respectively provided to the logic block 130 of the RF chip 100 and the logic block 220 of the BB chip 200.

As the RF chip 100 and the BB chip 200 perform digital communication, a converter for analog-to-digital conversion and a converter for digital-to-analog conversion may be disposed in the RF chip 100. In other words, analog circuits, such as an ADC and a digital-to-analog converter (DAC), may be removed from the BB chip 200, and thus, the size of the BB chip 200 may be reduced and current consumption of the BB chip 200 may also be reduced.

Each of the digital interfaces 110 and 210 may include pins for transmission and reception of various digital signals. For example, data DATA and a clock signal CLK may be transmitted or received between the digital interface 110 of the RF chip 100 and the digital interface 210 of the BB chip 200. In addition, according to the embodiment, one or more pieces of control information Info_ctrl may be transmitted or received through a separate channel between the digital interface 110 of the RF chip and the digital interface 210 of the BB chip 200. According to an embodiment, the control information Info_ctrl may include a synchronization signal Sync for synchronizing various functional blocks, included in the RF chip 100 and the BB chip 200, with each other. Alternatively, the control information Info_ctrl may include an offset control signal Ctrl_offset for compensating for a frequency offset between the RF chip 100 and the BB chip 200. In addition, control information Info_ctrl for various mutual controls may be transmitted or received between the RF chip 100 and the BB chip 200.

As described above, each of the digital interfaces 110 and 210 may be defined as a block including various elements. For example, when it is assumed that each of the digital interfaces 110 and 210 includes elements (for example, PHY and LINK blocks) related to transmission and reception of the data DATA/clock signal CLK, it may be explained that the control information Info_ctrl is transmitted or received between the RF chip 100 and the BB chip 200 through a separate path. Control information Info_ctrl provided to the RF chip 100 is provided to the digital interface 110 and/or the logic block 130, and control information Info_ctrl provided to the BB chip 200 is provided to the digital interface 210 and/or the logic block 220.

Hereinafter, although a case in which the RF chip 100 transmits data to the BB chip 200 is exemplified to describe an operation according to embodiments of the disclosure, the disclosure is not limited thereto. For example, the embodiments of the disclosure may also be applied to a case in which the BB chip 200 transmits data to the RF chip 100.

Each of the RF chip 100 and the BB chip 200 may operate by using a clock source such as a PLL included in each of the RF chip 100 and the BB chip 200. Although the RF chip 100 and the BB chip 200 are configured to respectively generate clock signals having the same frequency, the frequency of a clock signal that is actually generated by the RF chip 100 may be different from the frequency of a clock signal that is actually generated by the BB chip 200, and thus, overflow or underflow may occur to data, transmitted from the RF chip 100 to the BB chip 200, due to a frequency offset. In addition, since data is transmitted from the RF chip 100 to the BB chip 200 through various types of frequency domains, variation (for example, latency variation) may occur at the time when samples reach the logic block 220 of the BB chip 200.

According to the embodiment, the logic block 220 of the BB chip 200 may generate a frame synchronization signal Frame_sync for controlling sample output timing of the digital interface 210 and provide the frame synchronization signal Frame_sync to the digital interface 210. In other words, the digital interface 210 may temporarily store samples extracted by deframing received data and provide the samples to the logic block 220 at the time when the frame synchronization signal Frame_sync from the logic block 220 is active, and thus, a problem that latency variation occurs for each frame at the time when the logic block 220 receives the samples may be prevented.

According to an embodiment, a functional block inside or outside the logic block 220 of the BB chip 200 may generate a synchronization signal Sync, and the generated synchronization signal Sync may be transmitted to the RF chip 100 through a pin of the digital interface 210 of the BB chip 200. For example, the BB chip 200 may include a system timer (not shown) for providing various pieces of reference time information according to a communication method, such as 3G or LTE, and information from the system timer may be transmitted to the RF chip 100 as the synchronization signal Sync. Alternatively, information that is asynchronized with the system timer may be transmitted to the RF chip 100 as the synchronization signal Sync. Depending on the synchronization signal Sync, update timing (for example, frequency conversion timing) of a clock generator, e.g., PLL, included in the RF chip 100 may be synchronized with that of a clock generator, e.g., PLL, included in the BB chip 200. In addition, clock management timing (for example, clock division timing) of a clock management unit included in the RF chip 100 may be synchronized with that of a clock management unit included in the BB chip 200.

According to an embodiment, an offset control signal Ctrl_offset may be transmitted or received between the RF chip 100 and the BB chip 200 to compensate for a frequency offset between the RF chip 100 and the BB chip 200. For example, a functional block placed inside or outside the logic block 220 of the BB chip 200 may generate the offset control signal Ctrl_offset to compensate for the frequency offset stated above. According to an embodiment, the BB chip 200 may generate the offset control signal Ctrl_offset by monitoring a phase of a signal transmitted from the RF chip 100 and a phase of a signal (for example, the frame synchronization signal Frame_sync) of the inside of the BB chip 200. The clock generator, e.g., PLL, included in the RF chip 100 may increase or decrease a frequency of a clock signal based on the offset control signal Ctrl_offset.

According to the embodiments described above, although the RF chip 100 and the BB chip 200 respectively operate by different clock sources, performance degradation due to latency variation or a frequency offset may be reduced or prevented. According to an embodiment, a channel for transmitting data may use a lossy path, whereas a channel of transmitting the control information Info_ctrl may use a lossless path. Accordingly, overhead may be reduced as data re-transmission is not performed although an error occurs in some samples of data, whereas the performance of the communication system 10 may be improved as the reliability of the control information Info_ctrl is improved.

Hereinafter, various embodiments of the disclosure are described.

Figure 2:
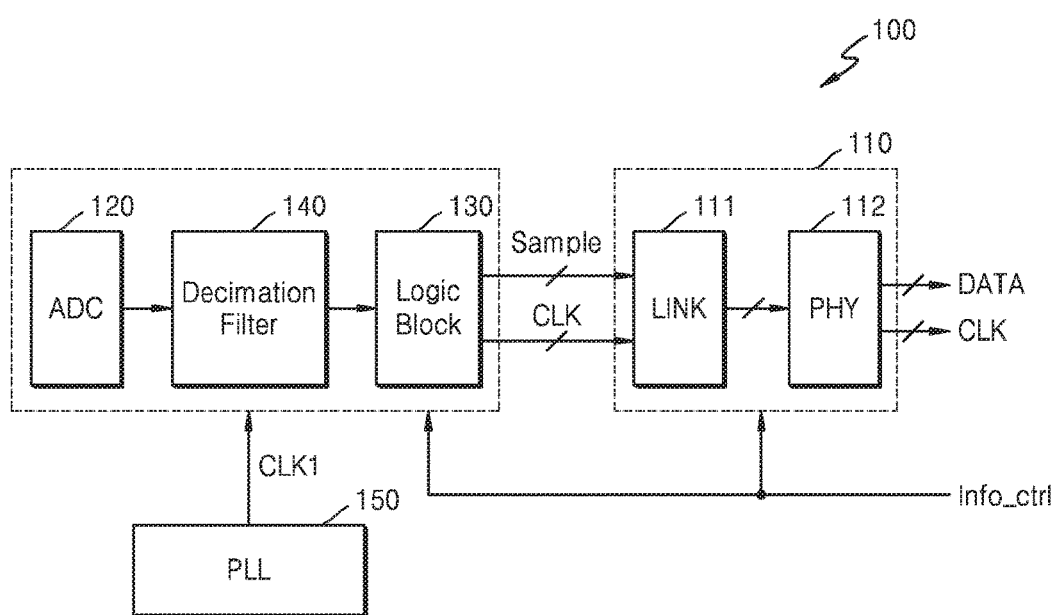
FIG. 2 is a block diagram illustrating an example of a detailed configuration of a radio frequency (RF) chip of FIG. 1.

FIG. 2 is a block diagram illustrating an example of a detailed configuration of the RF chip 100 of FIG. 1.

Referring to FIGS. 1 and 2, the RF chip 100 may include a digital interface 110, an ADC 120, and a logic block 130. Also, the RF chip 100 may include one or more filters, and a decimation filter 140 is illustrated in FIG. 2 as an example. The RF chip 100 may further include a PLL 150 as a clock source or a clock generator, and the digital interface 110 may include a LINK block 111 and a PHY block 112. In FIG. 2, although the decimation filter 140 is placed outside the logic block 130, the decimation filter 140 may be inside the logic block 130. In addition, although a PLL is exemplified as the clock generator, various circuits other than the PLL may be applied to the clock generator.

In the following embodiments, an example in which the digital interface 110 includes the LINK block 111 and the PHY block 112 and thus control information Info_ctrl received through a separate path is provided to the digital interface 110 will be described for convenience of description. However, as described above, the digital interface 110 may further include other elements (for example, an element for interfacing with the control information Info_ctrl), and thus, the control information Info_ctrl may be received through the digital interface 110 and the received control information Info_ctrl may be provided to a PHY/LINK block in the digital interface 110.

An example in which the ADC 120, the decimation filter 140, and the logic block 130 operate in a first frequency domain and the digital interface 110 operates in a second frequency domain is illustrated in FIG. 2. A clock signal CLK1 from the PLL 150 may be provided to various functional blocks in the first frequency domain. Although not illustrated in FIG. 2, the clock signal CLK1 from the PLL 150 may be frequency-converted and the frequency-converted clock signal may be provided to the digital interface 110. Alternatively, the RF chip 100 may further include a clock source (for example, PLL) corresponding to the second frequency domain, and a clock signal from the separate clock source (for example, PLL) may be provided to the digital interface 110. According to an embodiment, the second frequency domain may respond to a clock signal having a higher frequency, compared to the first frequency domain.

The RF chip 100 may further include functional blocks that perform various process operations, such as band filtering and low noise amplification for data received from an antenna, in addition to the elements illustrated in FIG. 2. According to an embodiment, the decimation filter 140 may receive data digitally converted by the ADC 120 and output data DATA having a rate decreased through a filtering operation. Accordingly, a bandwidth of pieces of data, which are transmitted or received between the RF chip 100 and the BB chip 200, may be reduced.

The LINK block 111 may generate a predetermined unit data (for example, frame data) through signal processing based on a predetermined rule (for example, communication protocol) and provide the generated unit data to the PHY block 112. For example, the LINK block 111 may generate frame data by framing samples received during a frame sync cycle, and the generated frame data may be transmitted to the BB chip 200 through the PHY block 112. Hereinafter, information that is transmitted to the BB chip 200 will be referred to as data or frame data or information that is transmitted to a logic block of the BB chip 200 will be referred to as data or samples. However, this is only an example, and terms that are stated in embodiments may be variously defined or interpreted.

According to an embodiment, the PHY block 112 of the RF chip 100 may transmit data DATA and a clock signal CLK to the BB chip 200, and various functional blocks in the RF chip 100 may be controlled according to the control information Info_ctrl, in the above-described embodiment, provided from the BB chip 200. The control information Info_ctrl may be provided to the various functional blocks in the RF chip 100.

Figure 3:
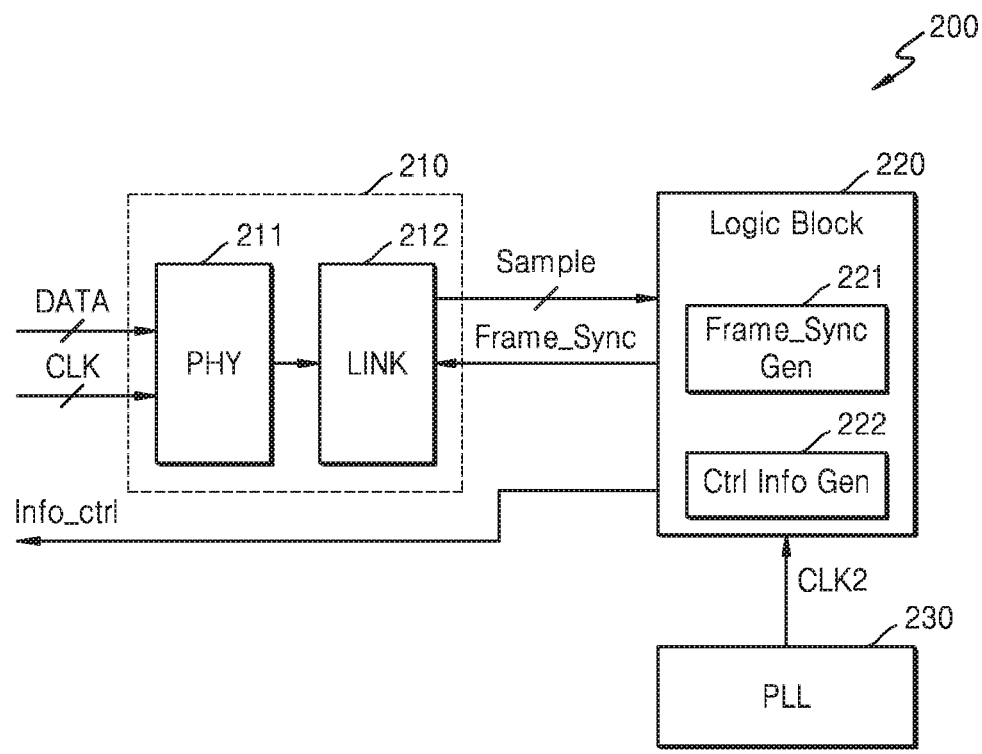
FIG. 3 is a block diagram illustrating an example of a detailed configuration of a baseband (BB) chip of FIG. 1.

FIG. 3 is a block diagram illustrating an example of a detailed configuration of the BB chip 200 of FIG. 1.

Referring to FIGS. 1 and 3, the BB chip 200 may include a digital interface 210, a logic block 220, and a PLL 230. The logic block 220 may include various functional blocks related to logic processing of data, and may include a frame synchronization signal generator 221 and a control information generator 222. Although the logic block 220 in FIG. 3 includes both the frame synchronization signal generator 221 and the control information generator 222, the logic block 220 may include only one selected from among the frame synchronization signal generator 221 and the control information generator 222, according to a modifiable embodiment.

In the BB chip 200, the logic block 220 may operate in a first frequency domain and the digital interface 210 may operate in a second frequency domain. A clock signal CLK2 from the PLL 230 may be provided to the logic block 220. According to an embodiment, the logic block 220 of the BB chip 200 may operate in the same frequency domain as the logic block 130 of the RF chip 100, and thus, the clock signal CLK2 from the PLL 230 may have substantially the same frequency as the clock signal CLK1 from the PLL 150 illustrated in FIG. 2.

The digital interface 210 may transmit or receive signals according the same rule as the digital interface 110 of the RF chip 100 described above. The digital interface 210 may include a PHY block 211 and a LINK block 212. The PHY block 211 may receive data DATA and a clock signal CLK from the RF chip 100. Control information Info_ctrl generated in the BB chip 200 may be transmitted to the RF chip 100 through a separate path (or a separate channel).

The LINK block 212 may perform deframing for data received from the PHY block 211 and temporally store a plurality of samples extracted from frame data. Also, the LINK block 212 may provide samples Sample to the logic block 220 in response to a frame synchronization signal Frame_sync instead of the time when the deframing is completed. In other words, although latency variation occurs at the time when the deframing is completed for each frame, the logic block 220 may receive samples in synchronization with the time when the frame synchronization signal Frame_sync is active. Accordingly, although a plurality of pieces of frame data having latency variations are transmitted to the BB chip 200 in this state, a search operation (for example, a correlation check operation for adjusting a code position of samples) may be prevented from being repeatedly performed.

As described in detail in the following embodiments, the control information generator 222 may generate synchronization information, which is used to synchronize various functional blocks in the RF chip 100 with various functional blocks in the BB chip 200, or the control information Info_ctrl including an offset control signal that is used to compensate for a frequency offset between the RF chip 100 and the BB chip 200.

In the embodiments of FIGS. 2 and 3, described above, the PHY block 112 of the RF chip 100 and the PHY block 211 of the BB chip 200 may perform digital communication according to various methods. The PHY block 112 of the RF chip 100 may operate according to a double data rate (DDR) method of transmitting data in synchronization with a rising edge and a falling edge of a clock signal having a frequency corresponding to the second frequency domain. Similarly, the PHY block 211 of the BB chip 200 may also operate according to the DDR method of transmitting data in synchronization with a rising edge and a falling edge of the clock signal.

Figure 4:
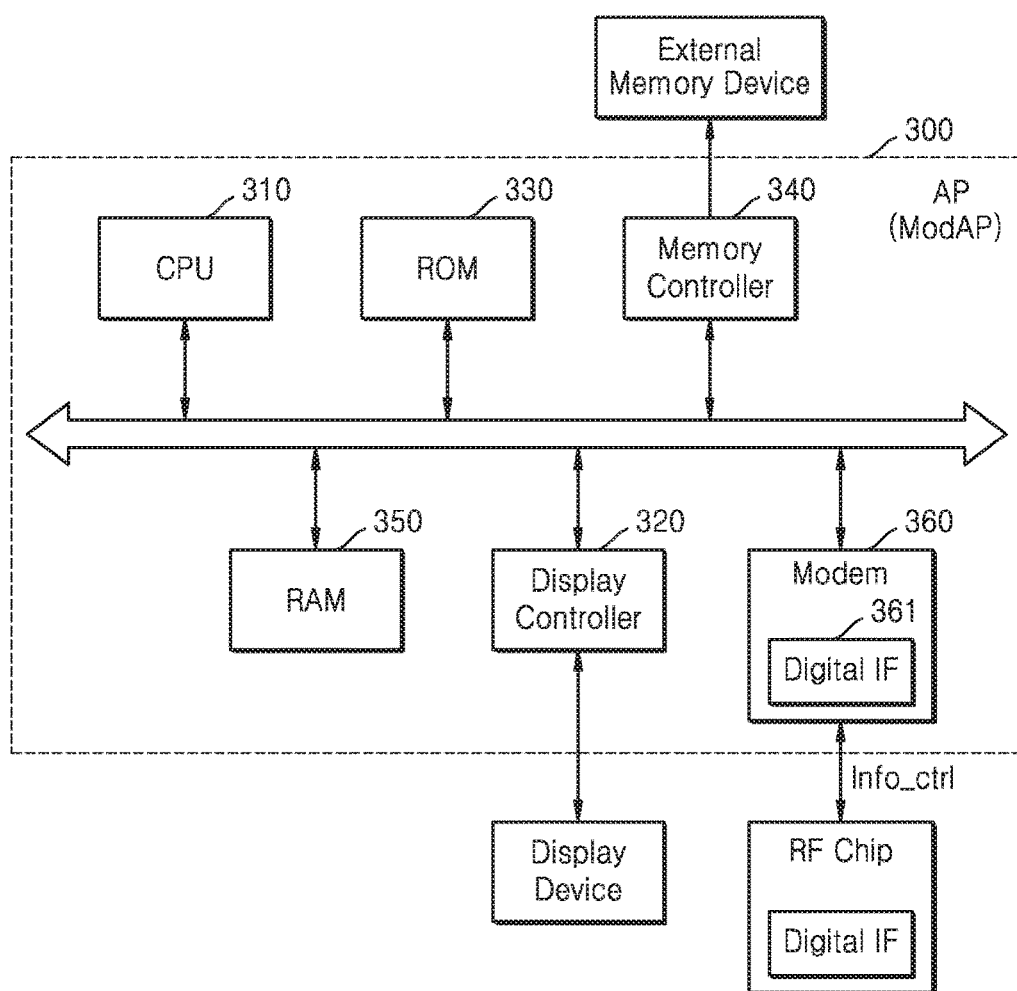
FIG. 4 is a block diagram illustrating an example of an application processor having functions that are performed by a modem chip according to an embodiment.

FIG. 4 is a block diagram illustrating an example of an application processor 300 having functions that are performed by a modem chip according to an embodiment. The application processor 300 of FIG. 4 may be referred to as ModAP since the functions of the modem chip are integrated in the application processor 300.

Referring to FIG. 4, the application processor 300 may be implemented with a system on chip (SoC), and may include a central processing unit (CPU) 310, a display controller 320, a read only memory (ROM) 330, a memory controller 340, a random access memory (RAM) 350, and a modem 360. In a manner that is substantially the same as that of the embodiment described above, the modem 360 may include a digital interface 361 and perform digital communication with an external RF chip.

The CPU 310 may process or execute programs and/or data stored in the ROM 330 and/or the RAM 350. According to an embodiment, the CPU 310 may control a function of the modem 360 by executing programs stored in the ROM 330 and/or the RAM 350. The ROM 330 may store programs and/or data in a nonvolatile manner and be implemented with erasable programmable read-only memory (EPROM) or electrically erasable programmable read-only memory (EEPROM). The RAM 350 may be implemented with a memory such as dynamic RAM (DRAM) or static RAM (SRAM).

The memory controller 340 may access an external memory device and write or read data by controlling the external memory device according to a data access request.

The display controller 320 may control a display operation of a screen by driving a display device.

The modem 360 may transmit or receive various signals to or from an external RF chip according to the embodiments described above. For example, the modem 360 may generate the frame synchronization signal Frame_sync described above, to control a timing of logic processing for data received from the external RF chip. Also, the modem 360 may transmit or receive control information Info_ctrl, which includes various pieces of information that are used to control a synchronization operation for the external RF chip or compensate for an offset, to or from the external RF chip through a separate pin (or a separate channel).

An apparatus including all elements (the ModAP, the external memory device, the display device, and the RF chip) illustrated in FIG. 4 may correspond to an implementation example of the communication system described above. In other words, the communication system may correspond to various terminals, and a communication system according to an embodiment may include the ModAP 300, i.e., the application processor 300, and various elements connected thereto.

Figure 5:
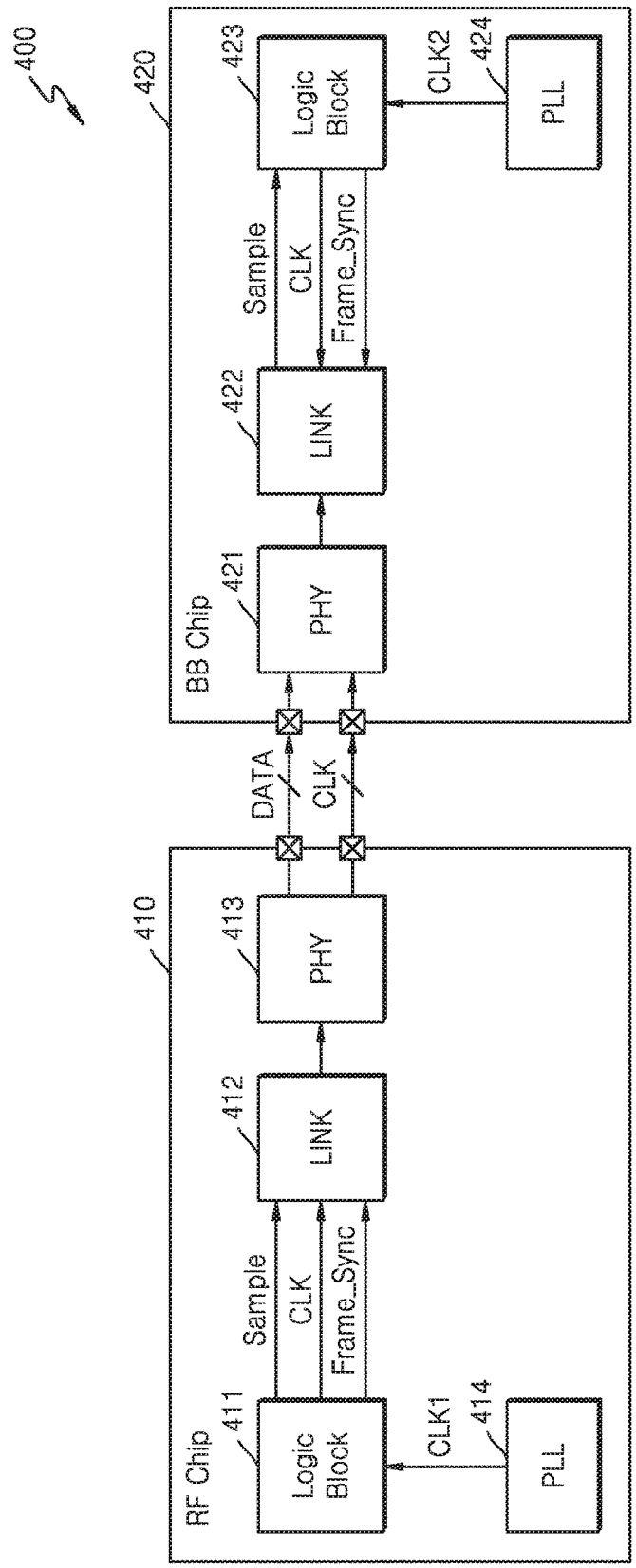
FIG. 5 is a block diagram illustrating an example of a communication system that performs data processing by using a frame synchronization signal.

FIG. 5 is a block diagram illustrating an example of a communication system 400 that performs data processing by using a frame synchronization signal. Since operations of elements that are the same as elements of the embodiments described above are the same as or similar to operations of the elements of the embodiments described above, detailed descriptions thereof are omitted.

Referring to FIG. 5, the communication system 400 may include an RF chip 410 and a BB chip 420. The RF chip 410 may include a logic block 411, a LINK block 412, a PHY block 413, and a PLL 414, and the BB chip 420 may include a PHY block 421, a LINK block 422, a logic block 423, and a PLL 424. In an ideal case, the frequency of a clock signal CLK1 that is output from the PLL 414 of the RF chip 410 may be the same as that of a clock signal CLK2 that is output from the PLL 424 of the BB chip 420.

According to an embodiment, the RF chip 410 and the BB chip 420 may generate respective frame synchronization signals Frame_sync. For example, the logic block 411 of the RF chip 410 may generate a frame synchronization signal Frame_sync based on the clock signal CLK1 from the PLL 414 and provide samples Sample to the LINK block 412 in synchronization with the generated frame synchronization signal Frame_sync. The logic block 411 may include a clock management unit (not shown) for generating various clock signals, and may provide one or more clock signals CLK to the LINK block 412.

Similarly, the BB chip 420 may receive data DATA and a clock signal CLK from the RF chip 410, and the LINK block 422 of the BB chip 420 may extract samples from received data and temporarily store the extracted samples. For example, the LINK block 422 may temporarily store samples received during a period of the frame synchronization signal Frame_sync and provide the samples Sample to the logic block 423 in synchronization with the frame synchronization signal Frame_sync.

Figure 6:
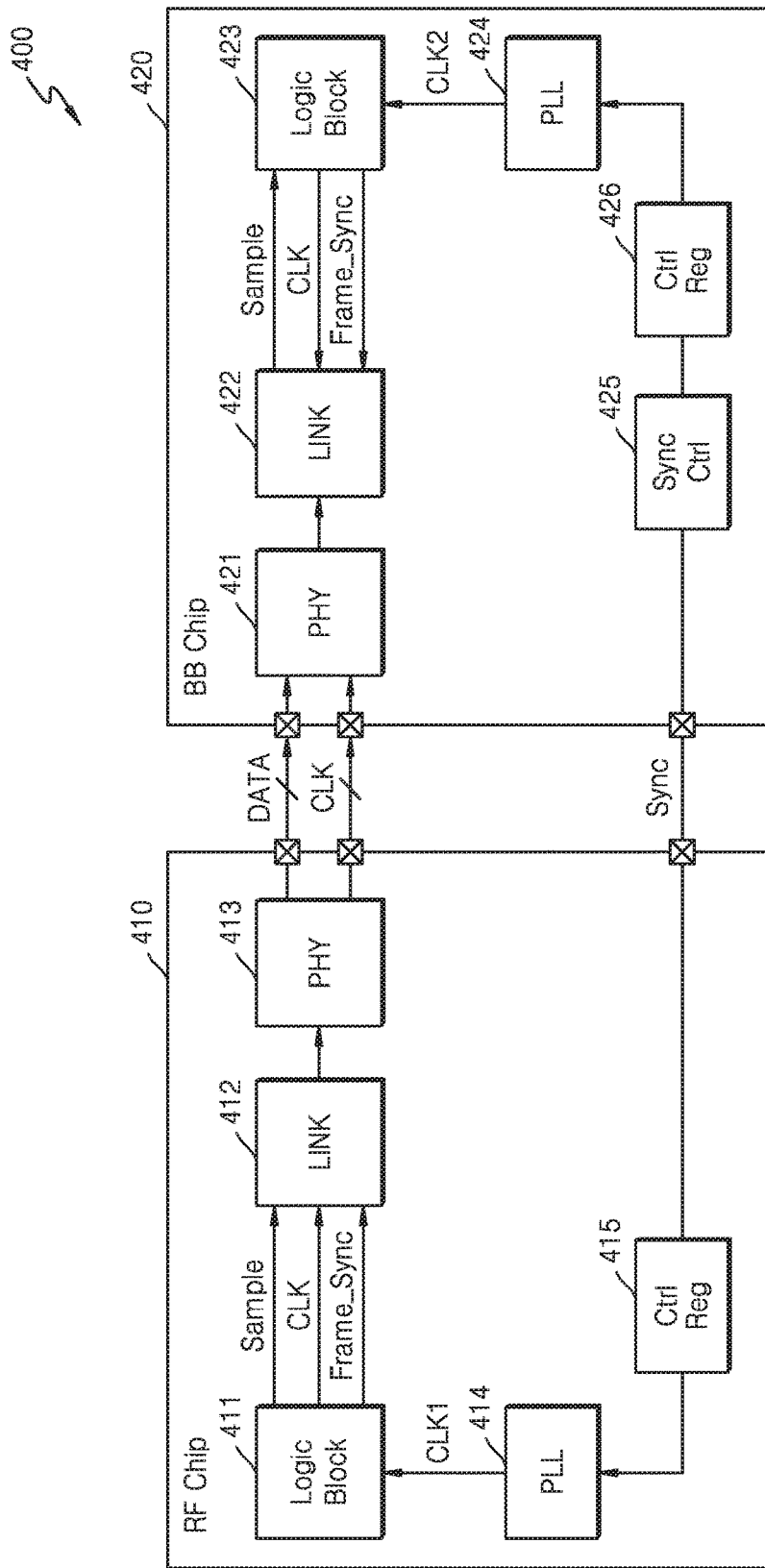
FIGS. 6 and 7 are a block diagram and a waveform diagram which illustrate an example in which a frame synchronization signal of an RF chip illustrated in FIG. 5 is synchronized with a frame synchronization signal of a baseband (BB) chip illustrated in FIG. 5.

FIG. 6 is a block diagram illustrating an example in which the frame synchronization signal Frame_sync of the RF chip 410 illustrated in FIG. 5 is synchronized with the frame synchronization signal Frame_sync of the BB chip 420 illustrated in FIG. 5.

Referring to FIGS. 5 and 6, the RF chip 410 may further include a control register 415 including setting information for controlling various functional blocks in the RF chip 410, in addition to the elements illustrated in FIG. 5. The BB chip 420 may further include a synchronization controller 425 for controlling synchronization with the RF chip 410 and a control register 426, in addition to the elements illustrated in FIG. 5. Various pieces of setting information for the control of the PLL 414 in the RF chip 410 may be stored in the control register 415 of the RF chip 410, and for example, update timing of the PLL 414 may be controlled according to the setting information. Similarly, update timing of the PLL 424 may be controlled according to setting information from the control register 426 of the BB chip 420.

The synchronization controller 425 may generate a synchronization signal Sync by using various pieces of information in the BB chip 420. For example, the BB chip 420 may include a system timer (not shown) for generating reference time information that is used in various types of communication, such as 3G and/or LTE. The synchronization controller 425 may generate the synchronization signal Sync based on information from the system timer and transmit the generated synchronization signal Sync to the RF chip 410 through a separate channel that is independent of the transmission of data DATA. According to a modifiable embodiment, as the system timer corresponds to the synchronization controller 425, the system timer may generate the synchronization signal Sync.

Based on the synchronization signal Sync, update timing of the PLL 414 of the RF chip 410 and update timing of the PLL 424 of the BB chip 420 may be synchronized with each other. Accordingly, a clock signal CLK1 from the PLL 414 and a clock signal CLK2 from the PLL 424 may be synchronized with each other, and the frame synchronization signal Frame_sync of the RF chip 410, which is generated based on the clock signal CLK1, and the frame synchronization signal Frame_sync of the BB chip 420, which is generated based on the clock signal CLK2, may be synchronized with each other.

Figure 7:
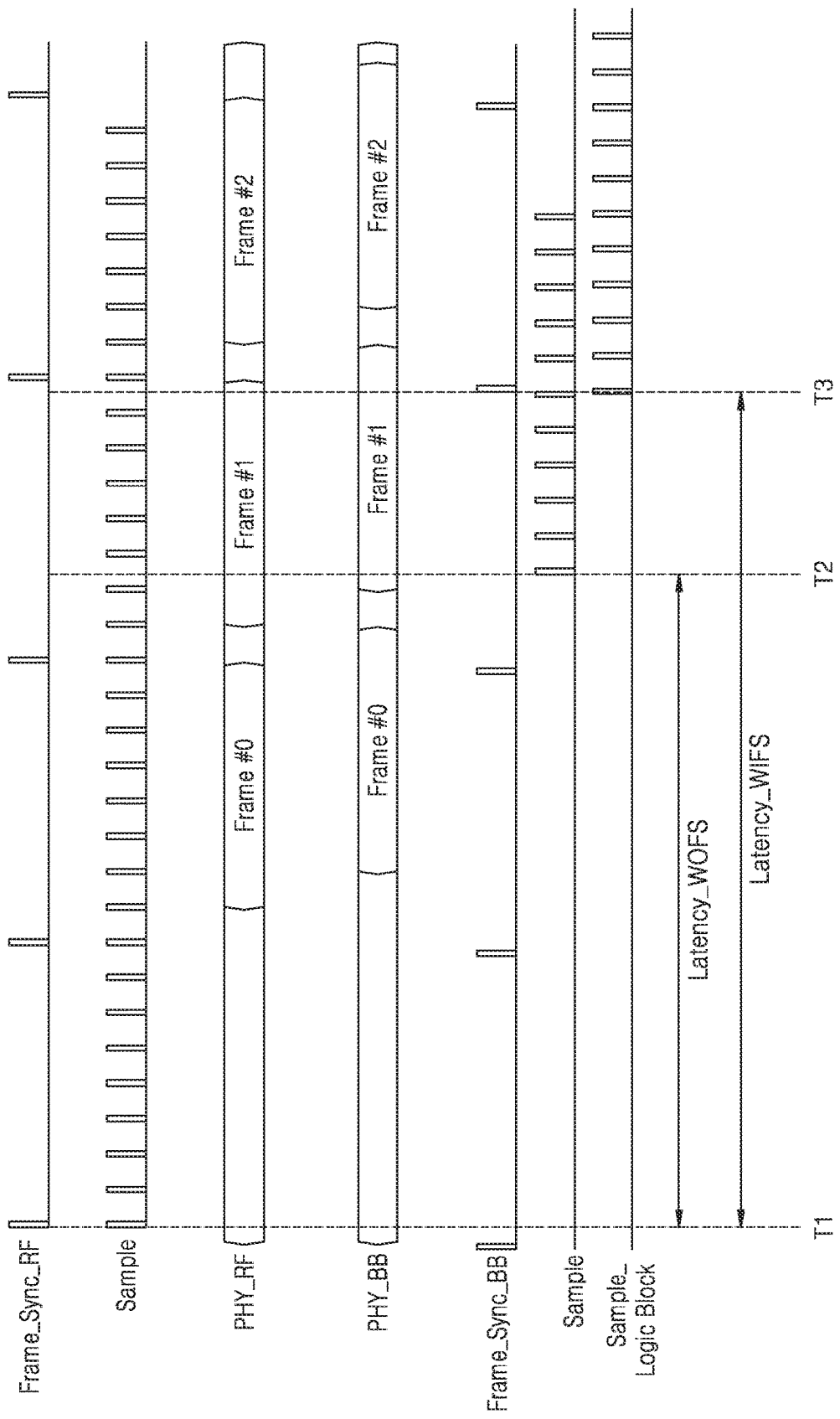

FIG. 7 is a timing diagram illustrating an operation example of the communication system according to the embodiment illustrated in FIG. 5.

Referring to FIGS. 5 and 7, a framing operation of configuring a frame is performed according to a frame synchronization signal Frame_sync_RF of the RF chip 410, and frame data is transmitted to the BB chip 420 through a PHY block PHY_RF of the RF chip 410. A plurality of pieces of frame data, i.e., first to third frame data Frame #0 to Frame #2, may be sequentially transmitted from the RF chip 410 to the BB chip 420, and hereinafter, the operation example illustrated in FIG. 7 is described with reference to the first frame data Frame #0.

The PHY block PHY_BB of the BB chip 420 receives first frame data Frame #0 through a delay, and when the reception of the first frame data Frame #0 is completed, a deframing operation for the first frame data Frame #0 is performed in a LINK block of the BB chip 420. When the deframing operation is completed, samples Sample of the first frame data Frame #0 are transmitted from the LINK block of the BB chip 420 to a logic block thereof.

When a frame synchronization signal Frame_sync_BB is not applied to the BB chip 420, the samples Sample are transmitted to the logic block at a time T2 when the deframing operation is completed. In this case, transmission latency Latency_WOFS of the first frame data Frame #0 from the RF chip 410 to the logic block of the BB chip 420 may correspond to a period between a time T1 and a time T2. However, as in the example described above, the time T2 may vary according to latency variation.

On the other hand, according to an embodiment, the samples Sample_Logic Block of the frame data Frame #0 may be transmitted to the logic block in response to the frame synchronization signal Frame_sync_BB. In this case, transmission latency Latency_WIFS of the first frame data Frame #0 may correspond to a period between the time T1 and the time T3. Since the time T3 corresponds to a time synchronized with the frame synchronization signal Frame_sync_BB, the time T3 may be prevented from varying by several clock cycles.

Figure 8:
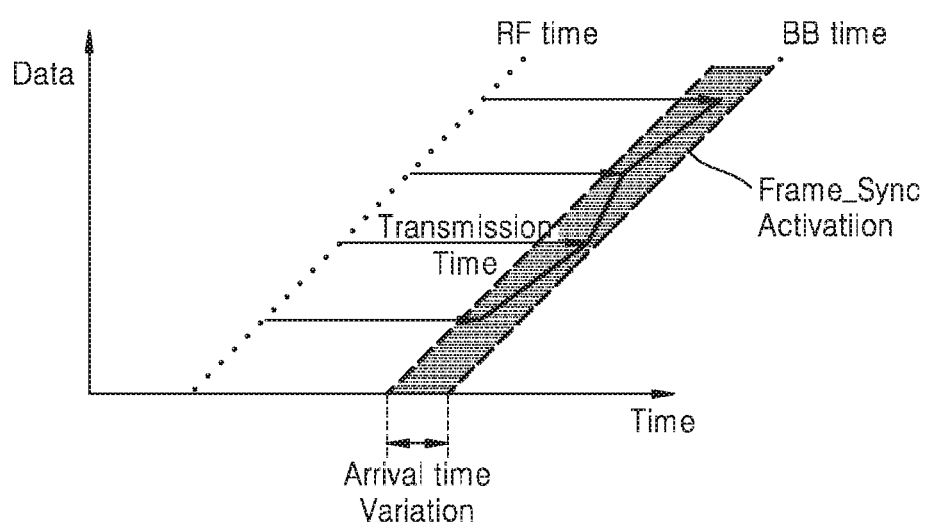
FIG. 8 is a graph illustrating an example in which latency variation is reduced in the communication system illustrated in FIG. 5.

FIG. 8 is a graph illustrating an example in which latency variation is reduced in the communication system 400 illustrated in FIG. 5.

Referring to FIG. 8, a time that is required until data from the logic block of the RF chip 410 reaches the logic block of the BB chip 420 may include a time that is required for the framing and deframing in a logic block, a time that is required for the transmission of data from a PHY block, and a time that is required for waiting for next data to be transmitted after the PHY block transmits the current data. In this case, latency variation may occur through various processes described above. However, according to the present embodiment, since samples are provided to the logic block of the BB chip 420 in synchronization with the activation timing of the frame synchronization signal Frame_ sync, the latency variation may be prevented from occurring.

Figure 9:
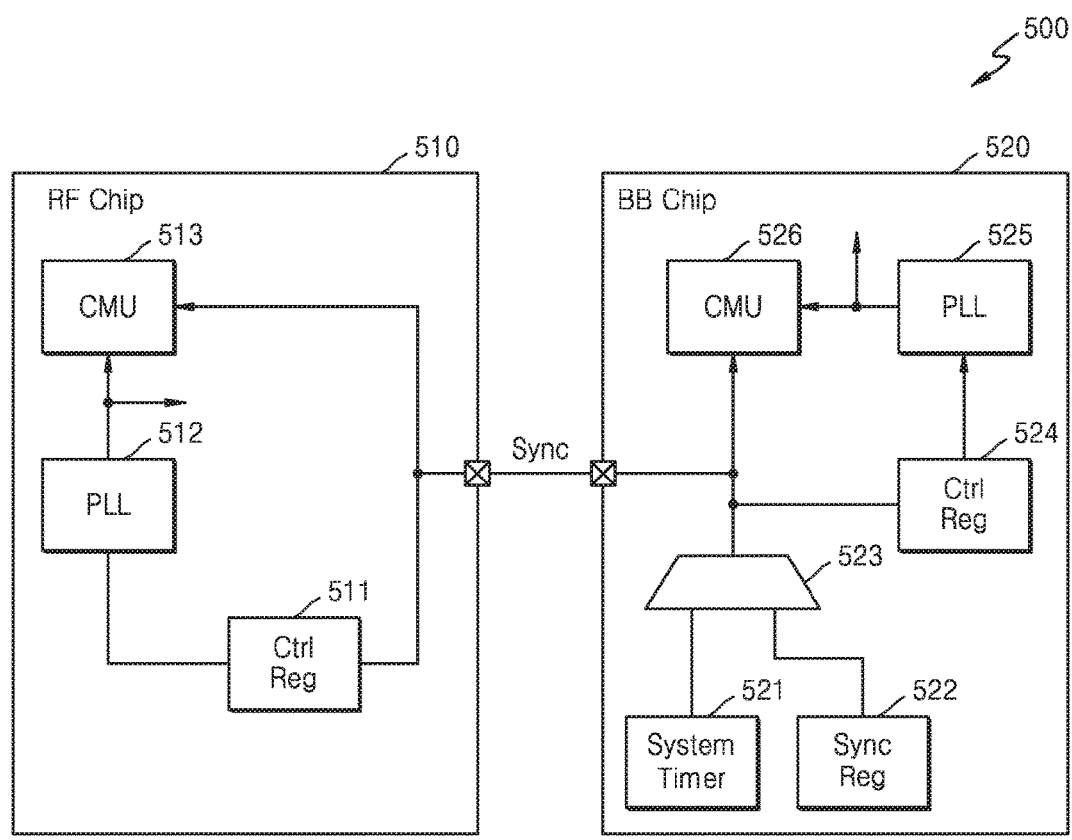
FIGS. 9 and 10 are block diagrams of a communication system illustrating a specific example of generating a synchronization signal.
Figure 10:
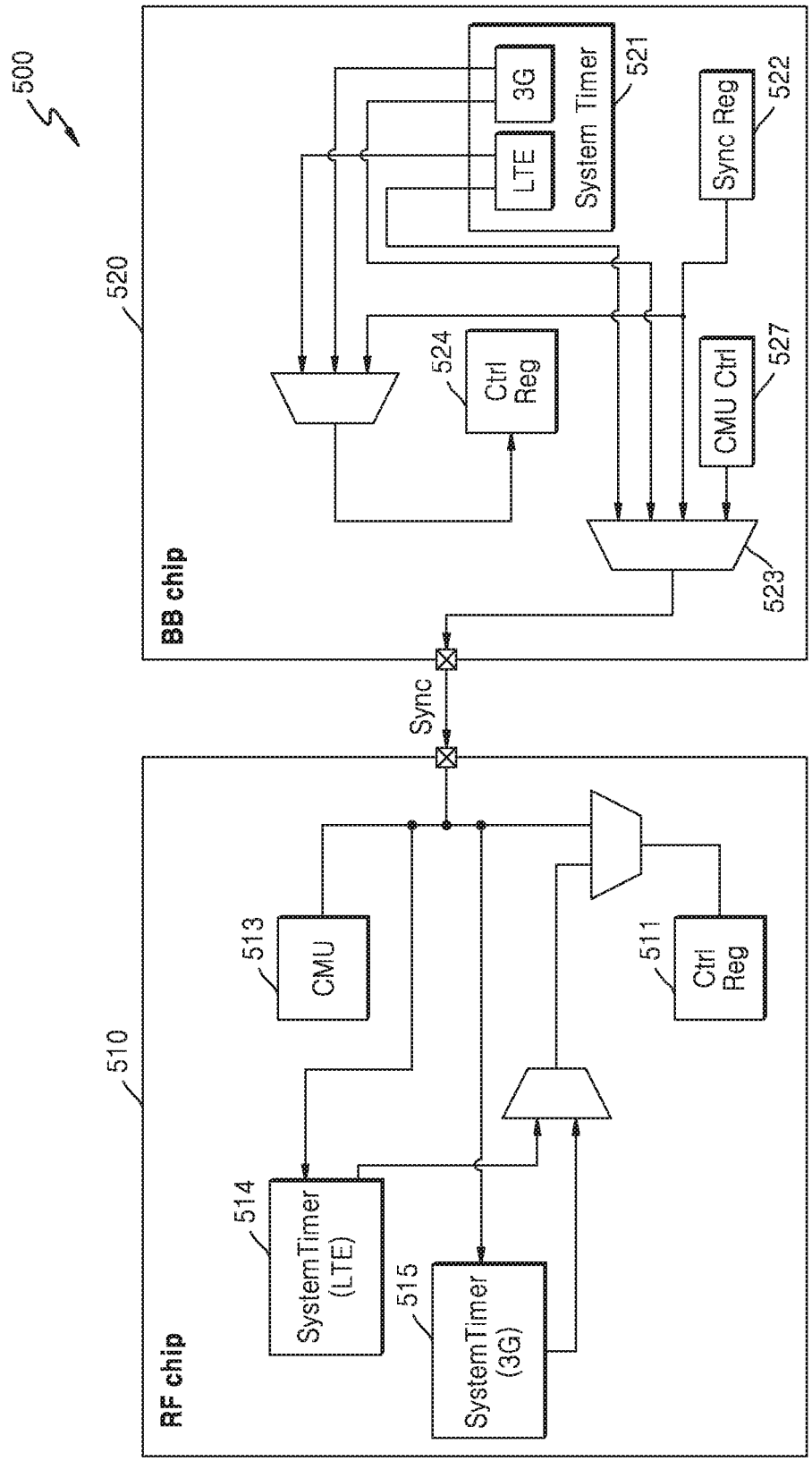

FIGS. 9 and 10 are block diagrams of a communication system 500 illustrating a specific example of generating a synchronization signal Sync.

Referring to FIG. 9, an RF chip 510 may include a control register 511, a PLL 512, and a clock management unit (CMU) 513. A BB chip 520 may include a system timer 521, a synchronization information register 522, a selector 523, a control register 524, a PLL 525, and a CMU 526. Although not illustrated in FIGS. 9 and 10 for convenience of description, each of the RF chip 510 and the BB chip 520 may further include a digital interface as described in the above-described embodiments. In addition, an output signal from the PLLs 512 and 525 may be used as a transmission clock signal of the digital interface, and an output signal from the CMUs 513 and 526 may be used as a modem clock (or a system clock). However, a clock configuration according to the embodiment of the disclosure may be variously modified.

The RF chip 510 may perform various control operations by using the synchronization signal Sync that is transmitted from the BB chip 520. According to an embodiment, the control register 511 of the RF chip 510 may store various pieces of setting information for controlling the PLL 512, and may control the update of the PLL 512 in response to the synchronization signal Sync. In the BB chip 520, the synchronization signal Sync may also be provided to the control register 524, and thus, the update timing of the PLL 512 of the RF chip 510 may be synchronized with the update timing of the PLL 525 of the BB chip 520.

The CMU 513 of the RF chip 510 may perform various clock management operations, such as a clock division operation, by using a clock signal from the PLL 512 and generate clock signals that are used in various functional blocks in the RF chip 510. The CMU 513 may perform a clock management operation in response to the synchronization signal Sync. For example, the timing of the clock division operation may be synchronized with the synchronization signal Sync. Similarly, in the BB chip 520, the synchronization signal Sync may also be provided to the CMU 526, and thus, a clock management operation of the CMU 513 of the RF chip 510 may be synchronized with a clock management operation of the BB chip 520.

The BB chip 520 may generate the synchronization signal Sync according to various methods and transmit the generated synchronization signal Sync to the RF chip 510 through a channel that is independent of a channel for data transmission. According to an embodiment, the system timer 521 may output information related to a reference time that is used in a communication method (for example, 3G and LTE) applied to the communication system 500. For example, in the LTE communication method, a transmission time interval (TTI) corresponding to a transmission period of a subframe may be defined as an example of the reference time, and the system timer 521 may output reference time information corresponding to the transmission period of the subframe. The reference time information may be transmitted to the RF chip 510 as the synchronization signal Sync, or the synchronization signal Sync may be generated by processing the reference time information and the generated synchronization signal Sync may be transmitted to the RF chip 510.

Alternatively, another signal that may be active asynchronously with the system timer 521 may be transmitted to the RF chip 510 as the synchronization signal Sync. For example, the synchronization information register 522 may store information for generating a predetermined signal, and may trigger a signal according to the control of a processing unit (not shown) to output the signal. The selector 523 may selectively transmit an output from the system timer 521 or an output from the synchronization information register 522 to the RF chip 510 as the synchronization signal Sync.

Various examples of the generation of the synchronization signal Sync are described below with reference to FIG. 10. In FIG. 10, a description of some of the elements included in the communication system 500 of FIG. 9 may be omitted for convenience of description.

The RF chip 510 may include various system timers 514 and 515 according to a communication method applied to the communication system 500. The control register 511 may control the update timing of the PLL 512, based on reference time information from the system timers 514 and 515 or a synchronization signal Sync transmitted from the BB chip 520. In addition, the CMU 513 of the RF chip 510 may also perform a clock management operation, based on the reference time information from the system timers 514 and 515 or the synchronization signal Sync transmitted from the BB chip 520. In addition, the synchronization signal Sync transmitted from the BB chip 520 may be provided to the system timers 514 and 515, and thus, a reference time of the system timers 514 and 515 of the RF chip 510 may be synchronized with the system timer 521 of the BB chip 520.

As illustrated in FIG. 10, the control register 524 in the BB chip 520 may be controlled by an output from the system timer 521 or an output from the synchronization information register 522. According to an embodiment, the BB chip 520 may further include a CMU control block 527 for controlling a CMU in the BB chip 520 regardless of the system timer 521, and an output from the CMU control block 527 may be transmitted to the RF chip 510 through the selector 523.

According to an embodiment as described above, operations of various functional blocks in the RF chip 510 may be synchronized with operations of functional blocks in the BB chip 520, and for example, the synchronization of CMUs, the synchronization (or reset) of system timers, and the simultaneous update of PLLs may be performed. According to an embodiment, a transmission delay of the synchronization signal Sync from the BB chip 520 to the RF chip 510 may be determined in the RF chip 510 or the BB chip 520.

The RF chip 510 or the BB chip 520 may adjust the timing of a synchronization operation or PLL update operation in consideration of the determined transmission delay, and thus, more accurate synchronization between the RF chip 510 and the BB chip 520 may be performed.

Figure 11:
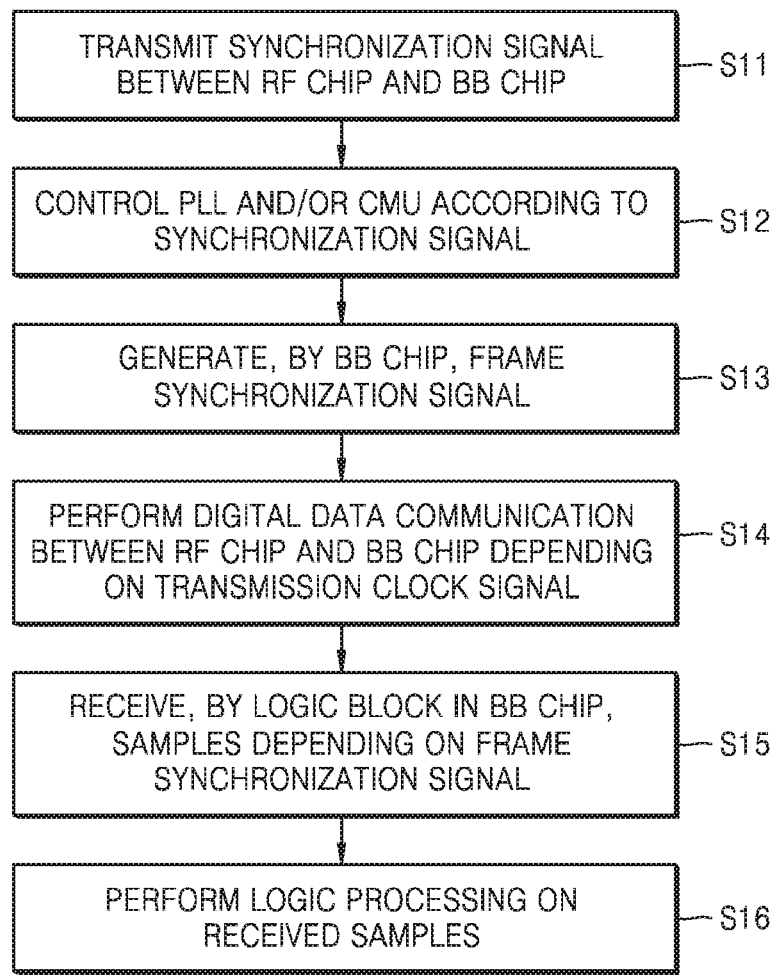
FIG. 11 is a flowchart illustrating an operating method of a communication system, according to an embodiment.

FIG. 11 is a flowchart illustrating an operating method of a communication system, according to an embodiment. For example, the operating method illustrated in FIG. 11 may be performed in a BB chip of the communication system.

Referring to FIG. 11, a synchronization signal may be transmitted between an RF chip of the communication system and the BB chip of the communication system (Operation S11). For example, the BB chip may transmit a synchronization signal according to the embodiments described above to the RF chip. A PLL and/or a CMU may be controlled according to the synchronization signal (Operation S12). For example, the BB chip may transmit a synchronization signal to the RF chip and control a PLL and/or a CMU in the BB chip by using the synchronization signal. Accordingly, operations of functional blocks, such as a PLL and/or a CMU in the RF chip, may be synchronized with operations of functional blocks, such as a PLL and/or a CMU in the BB chip.

The BB chip may generate a frame synchronization signal as described in the above-described embodiments (Operation S13). For example, the frame synchronization signal may be generated based on a clock signal for logic processing in the BB chip, and the generated frame synchronization signal may be provided to a LINK block of a digital interface in the BB chip. The BB chip generates a clock signal, which is used as a transmission clock signal, and provides the clock signal to a PHY block, and digital data communication between the RF chip and the BB chip is performed depending on the transmission clock signal (Operation S14). A LINK block of the BB chip extracts a plurality of samples from data received through a PHY block and temporarily stores the extracted samples, and a logic block in the BB chip receives the samples in response to the frame synchronization signal (Operation S15). The logic block may perform logic processing on the received samples (Operation S16).

Hereinafter, an operation of a communication system according to various modifiable embodiments will be described. Although some elements may not be illustrated in drawings, which are provided to describe embodiments, for convenience of description, embodiments of the disclosure are not limited to elements illustrated in the drawings.

Figure 12:
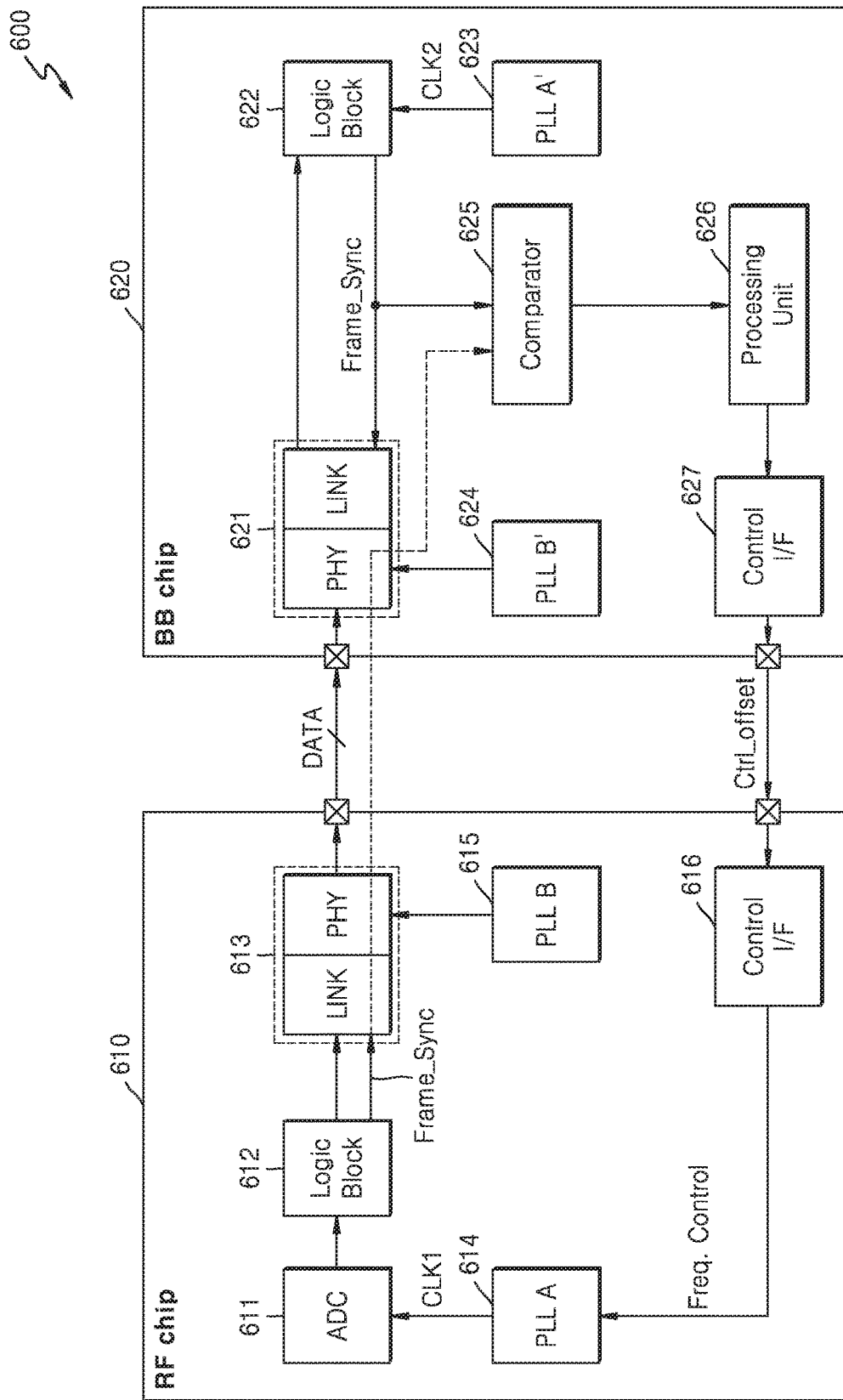
FIG. 12 is a block diagram illustrating an example of a communication system using a frequency offset compensation function.

FIG. 12 is a block diagram illustrating an example of a communication system 600 using a frequency offset compensation function.

Referring to FIG. 12, an RF chip 610 may include an ADC 611, a logic block 612, a digital interface 613, a first PLL 614, a second PLL 615, and a control interface 616. A BB chip 620 may include a digital interface 621, a logic block 622, a first PLL 623, a second PLL 624, a comparator 625, a processing unit 626, and a control interface 627. An offset control signal Ctrl_offset may be transmitted or received between the RF chip 610 and the BB chip 620.

According to an embodiment, the first PLL 614 in the RF chip 610 and the first PLL 623 in the BB chip 620 may be set to respectively generate clock signals having the same frequency. However, since the RF chip 610 and the BB chip 620 use different clock sources, a clock signal CLK1, which is generated by the first PLL 614 of the RF chip 610, and a clock signal CLK2, which is generated by the first PLL 623 of the BB chip 620, may be different in frequency. In this case, a period of a frame synchronization signal Frame_sync that is generated by the RF chip 610 may be different from that of a frame synchronization signal Frame_sync that is generated by the BB chip 620, and thus, the speed of samples that are provided to a LINK block in the BB chip 620 may be different from that of samples that are transmitted from the LINK block to the logic block 622. Due to the difference, overflow or underflow described in the above-described embodiment may be caused.

The comparator 625 may detect a frequency offset based on various methods and generate a result of the detection. For example, the comparator 625 may compare an input phase of data (or samples) received from the RF chip 610 to a phase of a signal in the BB chip 620. For example, the comparator 625 may compare a phase of a start of transmission (SOT) from the RF chip 610 to a phase of the frame synchronization signal Frame_sync in the BB chip 620. When a frequency offset occurs, a difference between the phase of the SOT and the phase of the frame synchronization signal Frame_sync gradually increases as time goes by, and the comparator 625 may determine whether a detected phase difference exceeds a predetermined threshold.

In response to a comparison result from the comparator 625, an offset control signal Ctrl_offset for compensating for a frequency offset is generated under the control of the processing unit 626 and the generated offset control signal Ctrl_offset is provided to the RF chip 610 through the control interface 627 of the BB chip 620. The first PLL 614 of the RF chip 610 may generate a clock signal CLK1 having a frequency adjusted in response to the offset control signal Ctrl_offset.

As a modifiable embodiment, the BB chip 620 may control the first PLL 623 therein to compensate for an offset. In other words, overflow or underflow in the LINK block of the BB chip 620 may be prevented through offset compensation of adjusting the frequency of the clock signal CLK2 from the first PLL 623.

Figure 13:
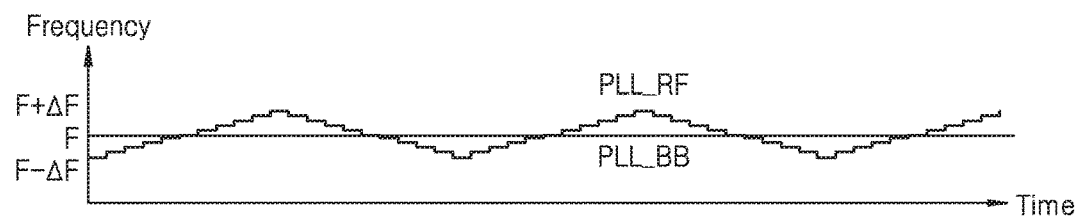
FIG. 13 is a graph illustrating an example in which a frequency offset is compensated in the communication system illustrated in FIG. 12.

FIG. 13 is a graph illustrating an example in which a frequency offset is compensated for in the communication system illustrated in FIG. 12. FIG. 13 illustrates an example in which an offset occurs as the frequency of the clock signal CLK2 generated from the first PLL 623 of the BB chip 620 remains constant, whereas the frequency of the clock signal CLK1 from the first PLL 614 of the RF chip 610 varies.

Referring to FIG. 13, as the frequency of the clock signal CLK1 from the first PLL 614 of the RF chip 610 is low by a threshold ΔF or more, compared to a reference frequency F, a phase difference exceeding a predetermined threshold may be detected by the comparator 625. Accordingly, an offset compensation operation may be performed, and thus, the frequency of the clock signal CLK1 from the first PLL 614 may gradually increase. In addition, as the frequency of the clock signal CLK1 from the first PLL 614 of the RF chip 610 is high by the threshold ΔF or more, compared to the reference frequency F, an offset compensation operation may be performed, and thus, the frequency of the clock signal CLK1 from the first PLL 614 may gradually decrease.

Figure 14:
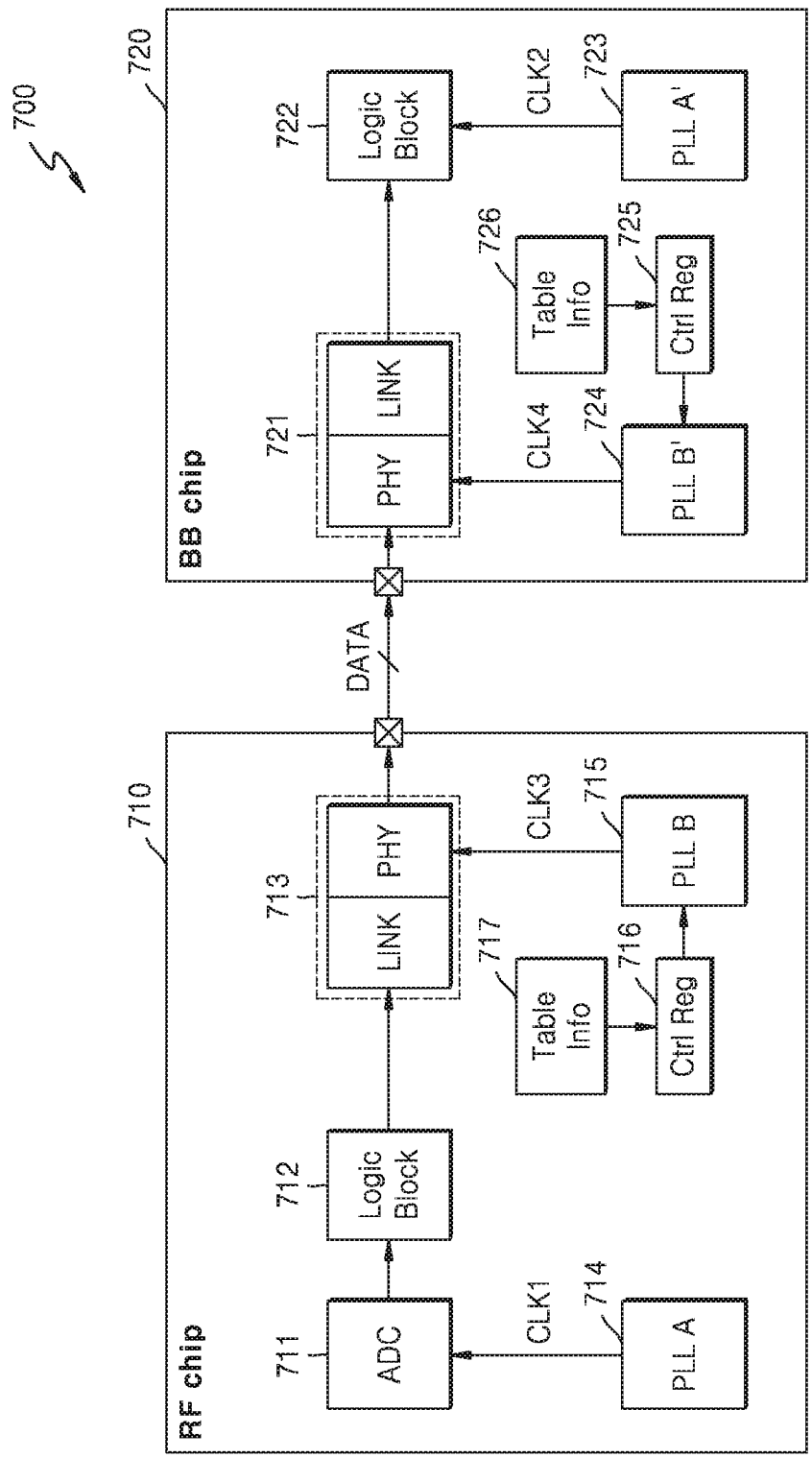
FIGS. 14 to 16 are block diagrams of communication systems according to other modifiable embodiments.
Figure 15:
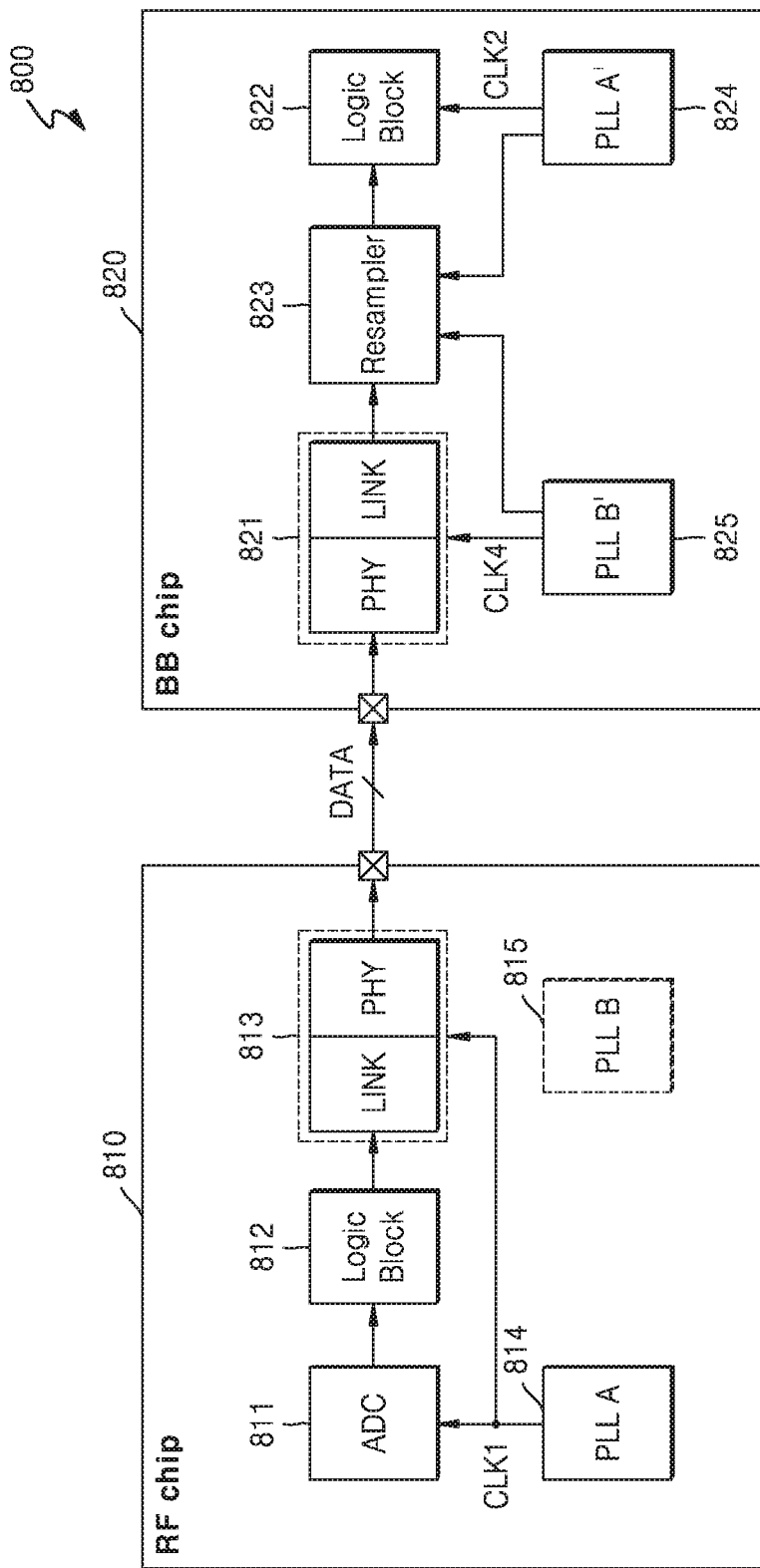

FIGS. 14 and 15 are block diagrams of communication systems 700 and 800 according to other modifiable embodiments. FIGS. 14 and 15 illustrate examples in which RF interference that may occur according to the use of a digital interface decreases.

Referring to FIG. 14, an RF chip 710 may include an ADC 711, a logic block 712, a digital interface 713, a first PLL 714, a second PLL 715, a control register 716, and a table information storage unit 717. A BB chip 720 may include a digital interface 721, a logic block 722, a first PLL 723, a second PLL 724, a control register 725, and a table information storage unit 726.

As the digital interfaces 713 and 721 operate in the same frequency domain, a clock signal CLK3 from the second PLL 715 of the RF chip 710 and a clock signal CLK4 of the second PLL 724 of the BB chip 720 may have the same frequency. In the RF chip 710, the control register 716 may store various pieces of setting information for controlling the second PLL 715, and the table information storage unit 717 may store table information related to a communication frequency through an antenna of the RF chip 710 and the frequency of the clock signal CLK3 that is used as a transmission clock signal for data transmission between the RF chip 710 and the BB chip 720. Similarly, the table information storage unit 726 of the BB chip 720 may store the same table information as the table information storage unit 717 of the RF chip 710.

For example, when a frequency band of a transmission clock signal that is used in digital communication between the RF chip 710 and the BB chip 720 overlaps with a frequency band in a communication through an antenna of the RF chip 710, RF interference may be caused in data that is received through the antenna of the RF chip 710. According to the current embodiment, in order to reduce or remove the RF interference, an avoidance frequency may be applied to the transmission clock signal for digital communication between the RF chip 710 and the BB chip 720.

For example, frequencies of the clock signals CLK3 and CLK4 corresponding to the transmission clock signal for digital communication between the RF chip 710 and the BB chip 720 may be adjusted within a range that is faster than a clock signal (for example, a system clock signal) for logic processing. The table information storage unit 717 of the RF chip 710 and the table information storage unit 726 of the BB chip 720 may output information of a transmission clock signal corresponding to a communication frequency through an antenna of the communication system 700, and the control registers 716 and 725 may provide setting information for adjusting the frequencies of the clock signals CLK3 and CLK4 that are output from the second PLLs 715 and 724, according to information that is output from the table information storage units 717 and 726.

According to an embodiment, during an initial setting process in which power is applied to the communication system 700, each of the RF chip 710 and the BB chip 720 may acquire information of a communication frequency of a communication service (for example, a base station or an access point) accessed by the communication system 700, and may adjust the frequency of a transmission clock signal, which is used in digital communication, based on the acquired information.

An example of reducing RF interference through a resample operation is illustrated in the embodiment of FIG. 15.

Referring to FIG. 15, an ADC 811 and a logic block 812, related to logic processing in an RF chip 810, and a digital interface 813 related to data transmission may operate in the same frequency domain to reduce the RF interference described above. For example, a clock signal CLK1 from a first PLL 814 of the RF chip 810 may be provided to the ADC 811, the logic block 812, and the digital interface 813. In the current embodiment, the first PLL 814 may generate the clock signal CLK1 having a frequency that is higher than that of the system clock signal applied to the embodiment of FIG. 14 and may avoid the RF interference described above.

As the ADC 811 operates in response to the clock signal CLK1, the ADC 811 may oversample data and output oversampled data.

The data oversampled in the RF chip 810 is provided to a resampler 823 through a digital interface 821 in a BB chip 820. A second PLL 825 in the BB chip 820 may generate a clock signal CLK4 corresponding to the frequency of the clock signal CLK1 generated in the first PLL 814 of the RF chip 810 and provide the generated clock signal CLK4 to the digital interface 821 and the resampler 823. The resampler 823 may receive a clock signal CLK2 having a low frequency corresponding to a system clock signal from a first PLL 824 in the BB chip 820 and provide samples having lowered data rate to a logic block 822.

In the embodiment of FIG. 15, a second PLL 815 that is in the RF chip and generates a transmission clock signal may be disabled. As a modifiable embodiment, the communication system of FIG. 15 may be implemented so that the first PLL 814 of the RF chip 810 is disabled and a clock signal from the second PLL 815, which has a frequency that may avoid RF interference, is provided to the ADC 811 and the digital interface 813.

Figure 16:
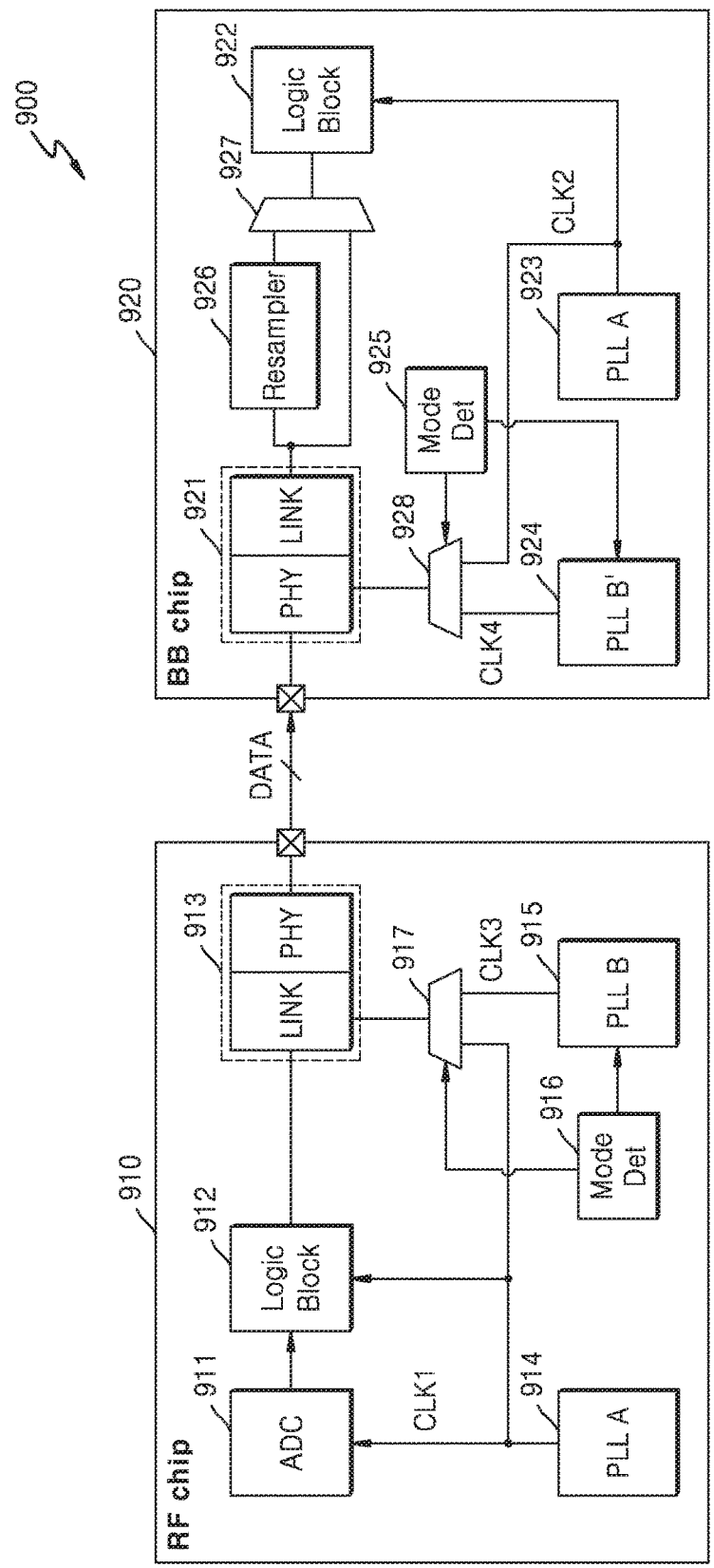

FIG. 16 is a block diagram of a communication system 900 according to another modifiable embodiment. An operation example for reducing power consumption occurring in a digital interface is illustrated in FIG. 16.

Referring to FIG. 16, an RF chip 910 may include an ADC 911, a logic block 912, a digital interface 913, a first PLL 914, a second PLL 915, a mode detector 916, and a selector 917. A BB chip 920 may include a digital interface 921, a logic block 922, a first PLL 923, a second PLL 924, a mode detector 925, a resampler 926, a first selector 927, and a second selector 928.

The communication system 900 may transmit or receive a relatively large amount of data or a relatively small amount of data depending on an operation mode. As an example, when the communication system 900 operates in a simple voice communication mode, the amount of data that is transmitted or received by the communication system 900 may be relatively small compared to another mode (for example, a case in which a large amount of information is transmitted or received). In this case, in a specific mode (hereinafter, referred to as a low power mode), power consumption in a digital interface may be reduced by lowering the frequency of a transmission clock signal between the RF chip 910 and the BB chip 920.

According to an embodiment, in the low power mode, one or more PLLs of the communication system 900 may be disabled, and a clock signal having a frequency that is lower than that of a transmission clock signal in other modes may be provided to the digital interface of the RF chip 910 and the digital interface 921 of the BB chip 920. For example, in a normal operation mode, the digital interface 913 of the RF chip 910 may receive a clock signal CLK3 having a relatively high frequency from the second PLL 915, and the digital interface 921 of the BB chip 920 may receive a clock signal CLK 4 having a relatively high frequency from the second PLL 924.

On the other hand, when the mode detector 916 of the RF chip 910 detects a low power mode, the second PLL 915 of the RF chip 910 may be disabled depending on the control of the mode detector 916. The selector 917 may selectively transmit a clock signal CLK1, which is generated from the first PLL 914, to the digital interface 913 under the control of the mode detector 916. The digital interface 913 may transmit data to the BB chip 920 in response to the clock signal CLK1 having a relatively low frequency.

Similarly, in the low power mode, the second PLL 924 of the BB chip 920 may be disabled depending on the control of the mode detector 925. The selector 928 may selectively transmit a clock signal CLK2, which is generated from the first PLL 923, to the digital interface 921 under the control of the mode detector 925. The digital interface 921 may receive data from the RF chip 910 in response to the clock signal CLK2 having a relatively low frequency.

In the low power mode described above, data DATA received through the digital interface 921 of the BB chip 920 may be provided to the logic block 922 through the resampler 926. According to an embodiment, the frequency of a transmission clock signal applied to the digital interface 921 in the low power mode may be different from the frequency of a system clock signal related to logic processing in the normal operation mode, and data (or samples) may be provided to the logic block 922 at a speed corresponding to the system clock signal through the resampler 926.

Figure 17:
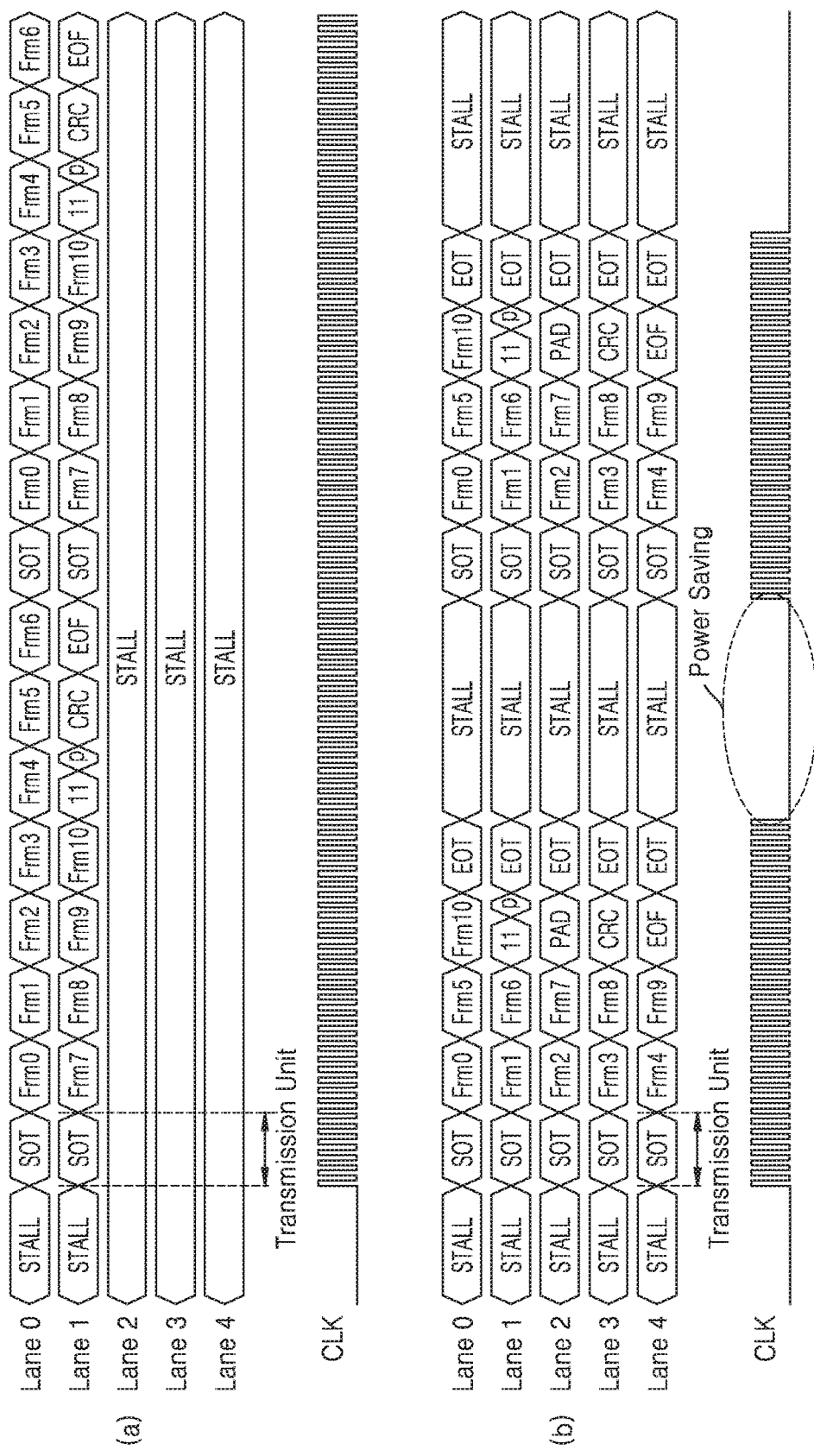
FIG. 17 is a diagram illustrating an example of a data ordering operation for data transmission in a digital interface of an RF chip.

Another example in which power consumption occurring in a digital interface is reduced is illustrated in FIG. 17. FIG. 17 is a diagram illustrating an example of a data ordering operation for data transmission in a digital interface of an RF chip.

Referring to FIGS. 16 and 17, a path in which data is transmitted through a channel may be defined as a lane, and a PHY block in the digital interface of the RF chip may transmit or receive data, depending on a transmission format as shown in (b) of FIG. 17. Various pieces of information, such as Start Of Transmission (SOT), End Of Transmission (EOT), End Of File (EOF), and Cyclical Redundancy Check (CRC), may be transmitted depending on a frame structure, and data (for example, pad bit) that is actually not used may be further transmitted to make the size of frame data constant.

As an example, in (a) of FIG. 17, data may be allocated to a next lane Lane 1 after data of a plurality of frames are allocated to any one lane Lane 0. As an example, when the amount of data that is transmitted from the RF chip 910 to the BB chip 920 is relatively small, data may be transmitted through only some of a plurality of lanes Lane 0 to Lane 4 and the rest of the lanes Lane 0 to Lane 4 may be deactivated (e.g., STALL). In this case, a clock signal CLK may be active in a period in which data is transmitted through one or more lanes, and be transmitted from the RF chip 910 to the BB chip 920.

On the other hand, data ordering for allocating a plurality of pieces of data to a plurality of lanes in parallel may be performed as shown in (b) of FIG. 17. In this case, since a larger number of lanes are used in data transmission, compared to (a) of FIG. 17, a period (i.e., transmission standby period STALL) in which data is not substantially transmitted may exist if the same amount of data is transmitted. According to an embodiment, the RF chip 910 may make a clock signal CLK inactive in the period STALL in which data is not transmitted, and as the clock signal CLK is inactive, power consumption in a data transmission process may be reduced.

The data ordering operation of FIG. 17 may be performed separately without the use of the embodiment illustrated in FIG. 16. For example, the data ordering operation of FIG. 17 may be used without lowering the frequency of a transmission clock signal of the digital interface. Alternatively, when the data ordering operation of FIG. 17 and the embodiment illustrated in FIG. 16 are used together, power that is consumed in the digital interface may be further reduced.

Figure 18:
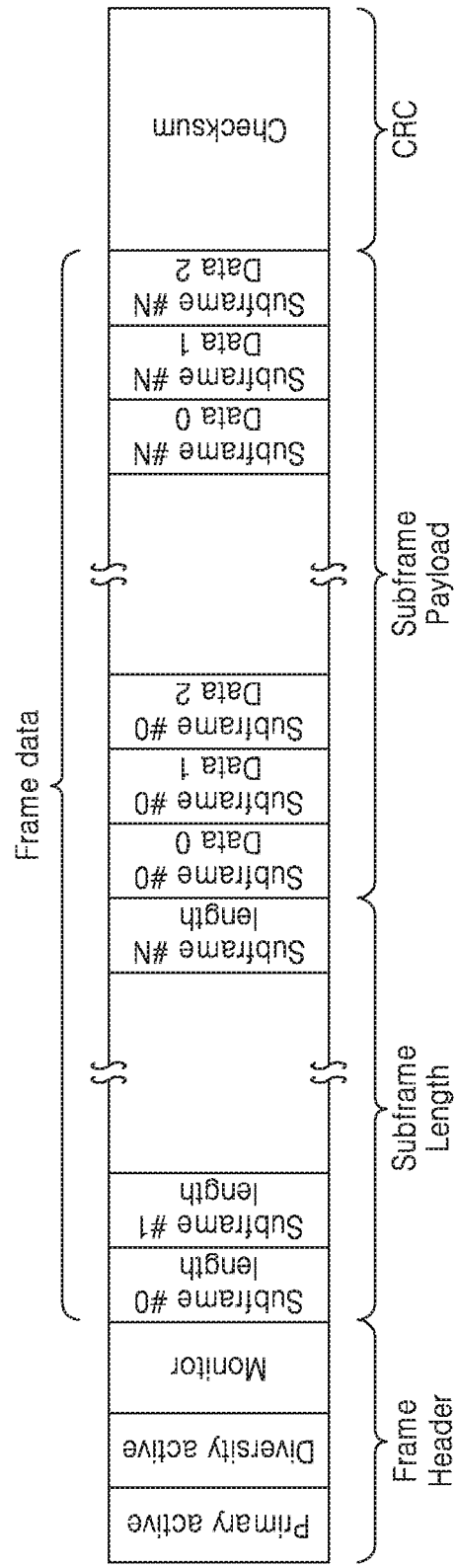
FIG. 18 is a diagram illustrating an example of a frame format of data that is transmitted between an RF chip and a BB chip.

An example in which overhead of data that is transmitted through a digital interface is reduced is illustrated in FIG. 18.

FIG. 18 is a diagram illustrating an example of a frame format of data that is transmitted between an RF chip and a BB chip.

A LINK block in a digital interface of each of the RF chip and the BB chip may perform framing or deframing according to the frame format illustrated in FIG. 18. As an example, the frame format may include a frame header area Frame Header, a subframe length area Subframe Length, a subframe payload area Subframe Payload, and a CRC area CRC. Each area may include one or more fields, and each field may include information having one or more bits.

As a communication system including the RF chip and the BB chip supports a multiple input multiple output (MIMO) system, the RF chip may communicate with the outside by using two types of antennas, and thus, channels that are used in communication between the RF chip and the BB chip may include a primary channel and a diversity channel. The frame header area Frame Header may include a primary active field Primary Active, a diversity active field Diversity Active, and a monitor field Monitor.

The primary active field Primary Active may include information related to a channel (or an active channel) through which actual data will be transmitted from among a plurality of channels corresponding to primary channels. The diversity active field Diversity Active may include information related to a channel through which actual data will be transmitted from among a plurality of channels corresponding to diversity channels. The monitor field Monitor may include state information, such as error situation and interrupt generation of the RF chip.

The subframe length area Subframe Length may include information (for example, length information) related to the number of samples of each subframe, with respect to data of units of subframes which will be transmitted through a plurality of channels. According to an embodiment, the position of a channel through which actual data will be transmitted may be determined based on information of the frame header area Frame Header, and the subframe length area Subframe Length may selectively include only length information related to a channel through which actual data is transmitted from among a plurality of channels. Accordingly, when the number of channels through which actual data will be transmitted is relatively small, the amount of information of the subframe length area Subframe Length may also decrease. The subframe payload area Subframe Payload may include data of a plurality of subframes, and the CRC area CRC may include CRC information (for example, checksum information) for performing an error check for data of the plurality of subframes.

According to the embodiment described above, the frame header area Frame Header includes information indicating whether there is the transmission of data through each channel, and only for a subframe of a channel through which actual data will be transmitted, length information and data is included in a frame format. Thus, the length of the frame format may dynamically vary. As the length of the frame format varies according to whether there is data to be transmitted through a channel, data transmission efficiency may be improved.

Figure 19:
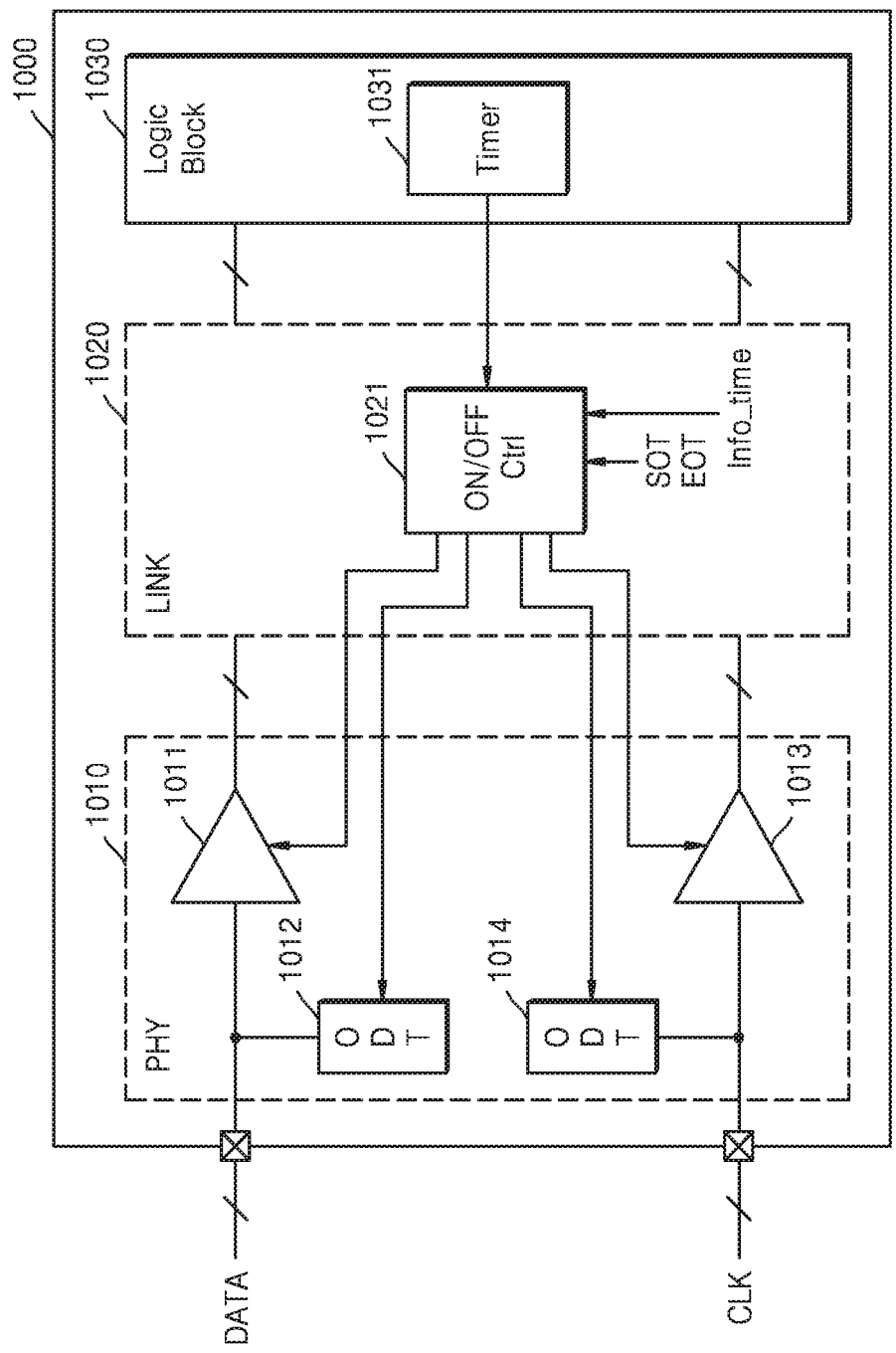
FIG. 19 is a block diagram illustrating an example of a BB chip in which an input buffer and an on-die termination (ODT) are applied to a digital interface.

Another example in which power consumption occurring in a digital interface is reduced is illustrated in FIG. 19. FIG. 19 is a block diagram illustrating an example of a BB chip 1000 in which an input buffer and an on-die termination (ODT) are applied to a digital interface.

Referring to FIG. 19, the BB chip 1000 may include a PHY block 1010, a LINK block 1020, and a logic block 1030. The BB chip 1000 may communicate with an RF chip via a plurality of channels, and the PHY block 1010 may include a plurality of input buffers 1011 and 1013, which correspond to the plurality of channels, and a plurality of ODTs 1012 and 1014 connected to the plurality of input buffers 1011 and 1013.

The LINK block 1020 may control the supply of power to the input buffers 1011 and 1013 and the ODTs 1012 and 1014, depending on an operation state of the BB chip 1000. The LINK block 1020 may include an ON/OFF controller 1021 that turns on or off the supply of power to the input buffers 1011 and 1013 and the ODTs 1012 and 1014. According to an embodiment, the logic block 1030 may include a timer 1031 that generates information for controlling the power of the input buffers 1011 and 1013 and the ODTs 1012 and 1014.

Each of the input buffers 1011 and 1013 may receive data DATA or a clock signal CLK through a channel and buffer the received data DATA or the received clock signal CLK. Each of the input buffers 1011 and 1013 may receive the data DATA or the clock signal CLK according to various methods. For example, each of the input buffers 1011 and 1013 may receive the data DATA or the clock signal CLK according to a DDR method, as in the embodiment described above. Each of the ODTs 1012 and 1014 may be connected to an input terminal of an input buffer corresponding thereto and improve the integrity of a signal that is received through a channel. However, when power is supplied to the input buffers 1011 and 1013 and the ODTs 1012 and 1014 in a period in which data is not transmitted, leakage current may occur in each of the input buffers 1011 and 1013 and each of the ODTs 1012 and 1014 and thus power consumption may increase.

According to an embodiment, the power of the input buffers 1011 and 1013 and the ODTs 1012 and 1014 may be controlled for each of the channels. As an example, the supply of power to an input buffer and an ODT connected to one or more channels through which data is actually not transmitted from among the plurality of channels may be turned off. Alternatively, when the BB chip 1000 enters a mode (for example, a sleep mode) in the BB chip 1000 does not perform an operation during a certain period, the supply of power to the input buffers 1011 and 1013 and the ODTs 1012 and 1014 of the BB chip 1000 may be turned off.

According to an embodiment, when the BB chip 1000 enters the sleep mode, the timer 1031 may provide information indicating a period corresponding to the sleep mode to the ON/OFF controller 1021 of the LINK block 1020. The ON/OFF controller 1021 may generate a control signal for blocking power that is supplied to an input buffer and an ODT.

The ON/OFF controller 1021 of the LINK block 1020 may detect various types of data that are transmitted through each of the channels, and may dynamically perform the control of power, for each channel, based on a detection result. According to an embodiment, the ON/OFF controller 1021 may perform a control operation, based on a detection result, so that power is supplied to input buffers and ODTs of some channels, whereas the supply of power to input buffers and ODTs of some other channels is blocked. For example, the ON/OFF controller 1021 may determine a start point of data transmission by detecting an SOT from among received information, and may estimate or determine a point at which the transmission of next data will be started, through predetermined time information Info_time. As an example, a time interval between a start point of current data transmission and a start point of next data transmission may correspond to the period of the frame synchronization signal Frame_sync in the embodiment described above, and the ON/OFF controller 1021 may receive time information Info_time having a period corresponding to the frame synchronization signal Frame_sync.

According to an operation example, when the ON/OFF controller 1021 initially detects an SOT, power may be supplied to an input buffer and an ODT, connected to a channel through which data will be received. Next, a point at which data transmission is completed is determined by detecting an EOT from among received information, and the supply of power to the input buffer and the ODT is blocked based on a result of the EOT detection. Next, as a predetermined time (for example, a time corresponding to the period of a frame synchronization signal) passes from a point at which a previous SOT has been detected, power is supplied to the input buffer and the ODT again. According to an embodiment, an input buffer and an ODT need to maintain an ON state before next data is actually received, and in this case, the input buffer and the OCT may be controlled so that power is supplied to the input buffer and the ODT at a point prior to a predetermined time by several clocks.

Figure 20:
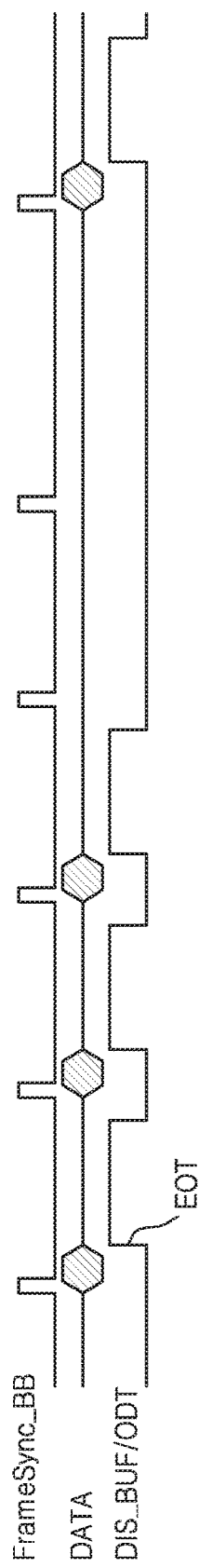
FIG. 20 is a waveform diagram illustrating an example of power control for an input buffer and an ODT in the BB chip illustrated in FIG. 19.

FIG. 20 is a waveform diagram illustrating an example of power control for an input buffer and an ODT in the BB chip 1000 illustrated in FIG. 19.

Referring to FIG. 20, data DATA may be received from an external RF chip within a period of the frame synchronization signal Frame_sync_BB in the BB chip 1000, and an EOT signal may be detected as the transmission of the data DATA from the RF chip is completed before a next period of the frame synchronization signal Frame_sync_BB arrives. A control signal DIS_BUF/ODT for blocking the supply of power to an input buffer and an ODT of a channel (or for disabling an input buffer and an ODT of a channel) may be active in response to the detection of the EOT signal.

The control signal DIS_BUF/ODT may be active during a predetermined time interval, and according to an embodiment, the predetermined time interval may be set in consideration of the period of the frame synchronization signal Frame_sync_BB. For example, the control signal DIS_BUF/ODT may be inactive prior to a point, at which the frame synchronization signal Frame_sync_BB is active again, by several clocks. Accordingly, the input buffer and the ODT may be enabled again and next data DATA may be received through the enabled input buffer and the enabled ODT.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A modem chip for communicating with a radio frequency (RF) chip, the modem chip comprising:
   a control information generator configured to generate control information for controlling a clock generator in the RF chip; and
   a digital interface configured to perform digital communication with the RF chip, transmit or receive data to or from the RF chip through at least one first pin, and transmit or receive the control information to or from the RF chip through at least one second pin.

2. The modem chip of claim 1, wherein a transmission path through the at least one first pin corresponds to a path that permits loss of information, and a transmission path through the at least one second pin corresponds to a path that does not permit loss of information.

3. The modem chip of claim 1, further comprising:
   a logic block configured to perform logic processing on data transmitted from the RF chip; and
   a first clock generator configured to provide a first clock signal corresponding to a system clock signal to the logic block, wherein
   the control information generator generates, as the control information, an offset control signal for compensating for a frequency offset between the first clock signal and a clock signal generated by a clock generator in the RF chip.

4. The modem chip of claim 3, further comprising a comparator configured to compare a phase of data received from the RF chip to a phase of a signal generated in the modem chip to obtain a comparison result, and to detect the frequency offset based on the comparison result to obtain a detection result, and
   wherein the control information generator generates the offset control signal according to the detection result.

5. The modem chip of claim 1, further comprising:
   a first clock generator configured to generate a first clock signal that is used in the modem chip; and
   a control register configured to store setting information for adjusting a frequency of the first clock signal, wherein
   update timing of the first clock generator is synchronized with update timing of the clock generator in the RF chip, depending on the control information.

6. The modem chip of claim 5, further comprising:
   a clock management unit configured to receive the first clock signal and perform a division operation on the first clock signal, wherein
   timing of the division operation of the clock management unit is synchronized with timing of a division operation of a clock management unit in the RF chip, depending on the control information.

7. The modem chip of claim 1, wherein:
   the digital interface receives data having a frame structure from the RF chip, and
   the data having the frame structure comprises a frame header area including information indicating a position of a channel that is active from among a plurality of channels, a subframe length area including length information of data of units of subframes which will be transmitted through the active channel, and a subframe payload area including data of each of the subframes.

8. The modem chip of claim 1, further comprising:
   a first clock generator configured to generate and provide a first clock signal to the digital interface; and
   a table information storage unit configured to store table information related to a communication frequency through an antenna of the RF chip and a frequency of the first clock signal, and
   wherein the first clock generator controls the frequency of the first clock signal in response to the table information according to the communication frequency applied to the RF chip.

9. The modem chip of claim 1, further comprising:
   a logic block configured to conduct logic processing on the data received from the RF chip;
   a first clock generator configured to provide a first clock signal to the digital interface;
   a second clock generator configured to provide a second clock signal to the logic block, the second clock signal having a lower frequency rather than the first clock signal; and
   a resampler configured to provide the data received through the digital interface to the logic block and receive the first clock signal and the second clock signal, and
   wherein the resampler receives the data oversampled from the RF chip in response to the first clock signal and provide the data to the logic block in response to the second clock signal.

10. The modem chip of claim 1, further comprising:
    a first clock generator configured to provide a first clock signal;
    a second clock generator configured to provide a second clock signal the second clock signal having a lower frequency rather than the first clock signal; and
    a mode detector configured to detect an operation mode of the modem chip,
    wherein, based on the control of the mode detector, the first clock signal is provided to the digital interface in a normal mode and the second clock signal is provided to the digital interface in a low power mode.

11. An application processor comprising:
    a central processing unit (CPU);
    a memory configured to store programs that are executable by the CPU; and
    a modem comprising a digital interface for communication with a radio frequency (RF) chip outside the application processor and a logic block for processing samples transmitted through the digital interface, wherein
    the samples are transmitted from the digital interface to the logic block in synchronization with a frame synchronization signal generated based on a clock signal in the modem.

12. The application processor of claim 11, wherein the digital interface comprises:
    one or more first pins configured to transmit or receive data including the samples to or from the RF chip; and
    one or more second pins configured to transmit or receive control information to or from the RF chip.

13. The application processor of claim 12, wherein the control information comprises a synchronization signal for synchronizing one or more functional blocks in the modem with one or more functional blocks in the RF chip.

14. The application processor of claim 12, wherein the control information comprises an offset control signal for compensating for a frequency offset between a clock generator in the modem and a clock generator in the RF chip.

15. The application processor of claim 14, wherein the modem comprises:
   a comparator configured to compare a phase of data received from the RF chip to a phase of the frame synchronization signal to obtain a comparison result, and to detect the frequency offset based on the comparison result to obtain a detection result, and
   a processing unit configured to generate the offset control signal according to the detection result.

16. A radio frequency (RF) chip for communicating with modem chip, the RF chip comprising:
   a logic block configured to perform logic processing on data to be transmitted to the modem chip; and
   a digital interface configured to transmit the data including a plurality of samples to the modem chip, based on digital communication,
   wherein the RF chip receives control information from the modem chip through the digital interface, and
   wherein a frequency of a clock signal generated in the RF chip is adjusted based on the received control information.

17. The RF chip of claim 16, wherein the control information comprises a synchronization signal for synchronizing one or more functional blocks in the RF chip with one or more functional blocks in the modem chip,
   wherein the RF chip further comprises a first clock generator configured to provide a first clock signal to the logic block, and
   wherein update timing of the first clock generator is synchronized with update timing of a clock generator in the modem chip, depending on the synchronization signal.

18. The RF chip of claim 16, wherein the RF chip further comprises a first clock generator configured to provide a first clock signal used in the logic processing,
   wherein the control information comprises an offset control signal for compensating for a frequency offset between the first clock signal and a clock signal generated in the modem chip, and
   wherein the first clock generator adjusts a frequency of the first clock signal based on the offset control signal.

19. The RF chip of claim 16, further comprising:
   a first clock generator configured to generate and provide a first clock signal to the digital interface; and
   a table information storage unit configured to store table information related to a communication frequency through an antenna of the RF chip and a frequency of the first clock signal, and
   wherein the first clock generator controls the frequency of the first clock signal in response to the table information according to the communication frequency applied to the RF chip.

20. The RF chip of claim 16, further comprising:
   a first clock generator configured to generate and provide a first clock signal to the logic block; and
   a control register configured to store setting information for controlling the first clock generator and control update timing of the first clock generator depending on the received control information,
   wherein the logic block generates a frame synchronization signal by using the first clock signal and transmits the samples to the digital interface in synchronization with the frame synchronization signal, and
   wherein the frame synchronization signal is synchronized with at least one signal in the modem chip based on the received control information.

* * * * *